United States Patent
Mori et al.

(10) Patent No.: US 8,774,737 B2
(45) Date of Patent: Jul. 8, 2014

(54) TRANSMISSION MODULE AND PHASED ARRAY ANTENNA APPARATUS

(75) Inventors: Kazutomi Mori, Tokyo (JP); Hiroyuki Joba, Tokyo (JP); Yoshinori Takahashi, Tokyo (JP); Tomohiro Akiyama, Tokyo (JP); Ryoji Hayashi, Tokyo (JP); Mitsuhiro Shimozawa, Tokyo (JP); Akira Inoue, Tokyo (JP); Morishige Hieda, Tokyo (JP); Kiyohide Sakai, Tokyo (JP); Yoshihito Hirano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/582,237

(22) PCT Filed: Mar. 4, 2010

(86) PCT No.: PCT/JP2010/053558
§ 371 (c)(1),
(2), (4) Date: Aug. 31, 2012

(87) PCT Pub. No.: WO2011/108103
PCT Pub. Date: Sep. 9, 2011

(65) Prior Publication Data
US 2012/0326781 A1    Dec. 27, 2012

(51) Int. Cl.
  *H04B 1/04*     (2006.01)
  *H01Q 11/12*    (2006.01)
  *H03F 1/32*     (2006.01)
  *H03F 1/02*     (2006.01)
  *H03G 3/00*     (2006.01)
  *H03G 3/30*     (2006.01)

(52) U.S. Cl.
  CPC ............ *H03F 1/3247* (2013.01); *H03F 1/0227* (2013.01); *H03F 1/0238* (2013.01); *H03F 2200/451* (2013.01); *H03G 3/004* (2013.01); *H03G 3/3042* (2013.01)
  USPC .............. 455/114.3; 455/126; 455/127.1; 455/127.2

(58) Field of Classification Search
  CPC ... H03F 1/3247; H03F 1/0227; H03F 1/0238; H03F 2200/451; H03G 3/004; H03G 3/3042
  USPC ........... 455/102, 108, 110, 114.3, 115.1, 126, 455/127.1, 127.2, 120
  See application file for complete search history.

(56) References Cited

U.S. PATENT DOCUMENTS 5,420,536 A * 5/1995 Faulkner et al. .............. 330/149
6,043,707 A * 3/2000 Budnik .......................... 330/10
(Continued)

FOREIGN PATENT DOCUMENTS

JP       61-52812 U     4/1986
JP       3-174810 A     7/1991
(Continued)

OTHER PUBLICATIONS

Japanese Office Action Issued May 14, 2013 in Patent Application No. 2012-502940 (with English translation of parts).

(Continued)

*Primary Examiner* — Duc M Nguyen
(74) *Attorney, Agent, or Firm* — Oblon, Spivak, McClelland, Maier & Neustadt, L.L.P.

(57) ABSTRACT

A transmission module including a power supply voltage control unit that sets a power supply voltage to the high frequency amplifier in a variable manner, and a control circuit that controls an amplitude control unit, a phase control unit and the power supply voltage control unit. The control circuit and the power supply voltage control unit control the power supply voltage in accordance with an output power of the high frequency amplifier. The transmission module can carry out not only phase control but also amplitude control in a continuous manner, while suppressing amplitude and phase variation, and a high frequency amplifier in the transmission module is made highly efficient. In addition, a large directional gain, a low side lobe level and a low power consumption are achieved, as a phased array antenna apparatus using a transmission module.

16 Claims, 16 Drawing Sheets

(56) References Cited

U.S. PATENT DOCUMENTS

| | | | |
|---|---|---|---|
| 6,366,177 B1* | 4/2002 | McCune et al. | 332/103 |
| 6,438,360 B1* | 8/2002 | Alberth et al. | 455/110 |
| 6,639,950 B1* | 10/2003 | Lagerblom et al. | 375/297 |
| 6,799,020 B1 | 9/2004 | Heidmann et al. | |
| 6,924,711 B2* | 8/2005 | Liu | 332/159 |
| 6,937,668 B2* | 8/2005 | Sridharan et al. | 375/296 |
| 8,340,604 B2* | 12/2012 | Drogi et al. | 455/114.3 |
| 2001/0020872 A1 | 9/2001 | Miyazawa | |
| 2001/0026600 A1 | 10/2001 | Mochizuki et al. | |
| 2005/0156662 A1* | 7/2005 | Raghupathy et al. | 330/10 |
| 2007/0184794 A1* | 8/2007 | Drogi et al. | 455/127.1 |
| 2007/0247253 A1* | 10/2007 | Carey et al. | 332/112 |
| 2007/0281637 A1 | 12/2007 | Ikedo et al. | |
| 2009/0081968 A1* | 3/2009 | Vinayak et al. | 455/110 |
| 2011/0006846 A1 | 1/2011 | Miho et al. | |

FOREIGN PATENT DOCUMENTS

| | | |
|---|---|---|
| JP | 6-196921 A | 7/1994 |
| JP | 7-79116 A | 3/1995 |
| JP | 8 37744 | 2/1996 |
| JP | 2001 257540 | 9/2001 |
| JP | 2002 124840 | 4/2002 |
| JP | 2003 527771 | 9/2003 |
| JP | 2004 320368 | 11/2004 |
| JP | 2006 135488 | 5/2006 |
| JP | 2007 174090 | 7/2007 |
| JP | 2009 302627 | 12/2009 |
| WO | 2007 135961 | 11/2007 |
| WO | 2008 072700 | 6/2008 |
| WO | WO 2008/090721 A1 | 7/2008 |

OTHER PUBLICATIONS

Mailloux, R.J., "Phased Array Antenna Handbook," Artech House Inc., Section 2.4.2. Fig 2.13, Section 2.4.3, Fig 2.17. Total 10 Pages, (1994).

International Search Report Issued Jun. 1, 2010 in PCT/JP10/53558 Filed Mar. 4, 2010.

* cited by examiner

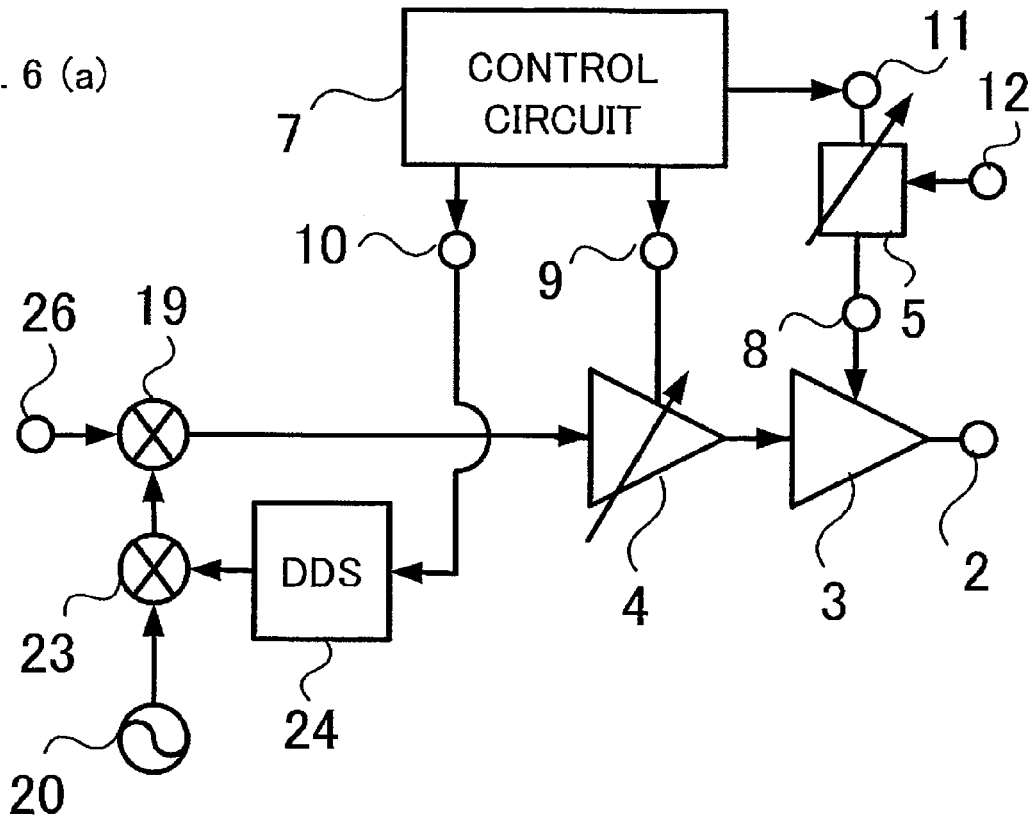
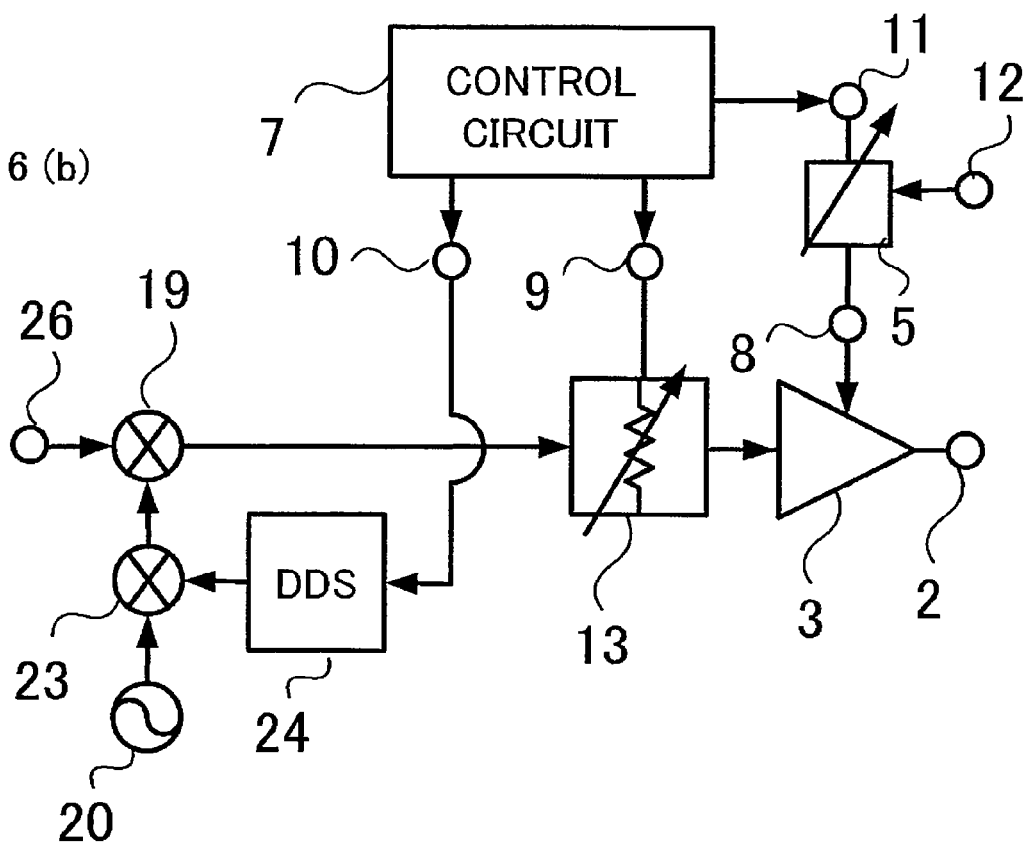

FIG. 10

| OUTPUT ELECTRIC POWER | VOLTAGE APPLIED TO AMPLIFIER | GAIN SETTING VALUES OF GAIN CHANGE UNIT | PHASE SETTING VALUES OF PHASE CHANGE UNIT |
|---|---|---|---|
| . | . | . | . |
| . | . | . | . |
| . | . | . | . |
| . | . | . | . |
| . | . | . | . |
| . | . | . | . |
| . | . | . | . |

FIG. 12

| OUTPUT ELECTRIC POWER | VOLTAGE APPLIED TO AMPLIFIER | GAIN SETTING VALUES OF GAIN CHANGE UNIT |
|---|---|---|
| . | . | . |
| . | . | . |
| . | . | . |
| . | . | . |
| . | . | . |
| . | . | . |
| . | . | . |

TRANSMISSION MODULE AND PHASED ARRAY ANTENNA APPARATUS

TECHNICAL FIELD

The present invention relates to a transmission module which is used for a phased array antenna apparatus.

BACKGROUND ART

In general, in transmission modules used for a phased array antenna apparatus, means for controlling the phases of output signals of the transmission modules is required for highly efficient operation in order to achieve a reduction in the power consumption of a high frequency amplifier (high output amplifier) within each transmission module, as well as in order to change the directivity of an antenna. In addition, in order to carry out beam forming, it is necessary to suppress an amplitude error and a phase error between the transmission modules connected to individual element antennas of the phased array antenna, respectively.

In the past, transmission modules used for a phased array antenna apparatus are constructed such that they are each provided with a high frequency amplifier and a phase shifter, so that the phases of the individual transmission modules are controlled in order to amplify a signal by means of the high frequency amplifier and to carry out beam forming by means of a phase shifter (for example, refer to a first patent document).

In addition, in the past, in a phased array antenna apparatus which uses a plurality of transmission modules, there has been proposed a method in which when a phased array antenna is formed by the use of transmission modules of the same output power, not only the phase but also the amplitude thereof can be controlled so as to obtain a sufficient directional gain and at the same time to reduce a side lobe level by thinning out element antennas so as to provide an amplitude distribution (for example, refer to a first nonpatent document).

Further, in a phased array antenna apparatus described in the first nonpatent document, in order to improve accuracy as well as to reduce the electric power consumption of the phased array antenna apparatus, a plurality of transmission modules, which are different in saturated output electric power from one another, are prepared, and the thinning out of antennas and combination of the antennas are carried out.

In this case, when a phased array antenna is formed by the use of transmission modules of the same saturated output electric power, element antennas are thinned out to provide an appropriate amplitude distribution, whereby not only the phase but also the amplitude thereof can be controlled so as to achieve that a sufficient directional gain is obtained or a side lobe level is reduced.

In addition, by preparing a plurality of transmission modules which are different in saturated output electric power from one another, and by combining this with the thinning out of the antennas thereby to provide an amplitude distribution, the electric power consumption of the antenna apparatus is reduced.

PRIOR ART REFERENCES

Patent Documents

[First Patent Document] Japanese patent application laid-open No. 2007-174090, FIG. 1(a), FIG. 3 and FIG. 4.

Nonpatent Documents

[First nonpatent document] Robert J. Mailloux, "Phased Array Antenna Handbook", Artech House Inc., 1994. Section 2. 4. 2 FIG. 2. 13, Section 2. 4. 3 FIG. 2. 17.

SUMMARY OF THE INVENTION

Problems to be Solved by the Invention

Although in the conventional transmission modules, for example in the first patent document, it is constructed such that each high frequency amplifier includes a phase shifter, and the phase of each transmission module can be controlled in order to amplify a signal as well as to carry out beam forming, there has been the following problem. That is, no particular mention is made of an amplitude error and a phase error among the transmission modules, and it is necessary to manage variations among the transmission modules so that the amplitude error and the phase error among the transmission modules are made equal in the individual modules, thus increasing the costs thereof.

In addition, no provision is made for means to control the amplitude of each transmission module, and hence, the amounts of output power of the transmission modules all become the same. As a result, in cases where a phased array antenna apparatus is formed by the use of the transmission modules described in the first patent document, there has been the following problem. That is, only the phases of signals radiated from individual antenna elements can be controlled, and hence a sufficient directional gain of an antenna can not be obtained or a side lobe level can not be reduced to a sufficient extent.

Further, it can also be considered that the output power of a part of the transmission modules is suppressed to be low in order to perform amplitude control, but in this case, there has been a problem that the efficiency of high frequency amplifiers in those transmission modules of which the output power has been made low becomes low, thus resulting in that the electric power consumption of an antenna apparatus becomes large.

On the other hand, in a control method for the phase and amplitude of a phased array antenna apparatus described in the first nonpatent document, an amplitude distribution is provided in a discrete manner by means of thinning, but it is not continuous, and besides, in the case of providing a large amplitude distribution, the interval of the element antennas becomes too large for a part where the amplitude is small. As a result, there has been a problem that it is impossible to achieve a large directional gain and a reduction in the side lobe level, which would otherwise be obtained in cases where the amplitude distribution is given in a continuous manner.

In addition, in cases where a plurality of transmission modules are prepared which are different in saturated output electric power from one another, there have been the following problems. That is, for a location with a small amplitude, a problem that the interval of element antennas becomes too large is not eliminated, and it is difficult to make small an amplitude error and a phase error among transmission modules which are different in saturated output electric power from one another, so the errors become large, and besides, it is necessary to develop a plurality of transmission modules with mutually different saturated output electric powers, thus resulting in that cost becomes high.

The present invention has been made in order to solve the problems as referred to above, and has for its object to achieve, in a phased array antenna apparatus, a transmission module for carrying out not only phase control but also amplitude control in a continuous manner, while suppressing amplitude and phase variation, as well as further to make a high frequency amplifier in the transmission module highly efficient.

In addition, it is another object to achieve a large directional gain, a low side lobe level and a low power consumption, as a phased array antenna apparatus using a transmission module.

Means for Solving the Problems

A transmission module according to the present invention is constructed to include a high frequency amplifier, an amplitude control unit that sets a gain of an input signal to the high frequency amplifier in a variable manner, and a phase control unit that sets a phase of the input signal to the high frequency amplifier in a variable manner, wherein the transmission module is provided with a power supply voltage control unit that sets a power supply voltage to the high frequency amplifier in a variable manner, and a control circuit that controls the amplitude control unit, the phase control unit and the power supply voltage control unit, and wherein the control circuit and the power supply voltage control unit control the power supply voltage in accordance with an output power of the high frequency amplifier.

Effect of the Invention

According to the present invention, it is possible to achieve a transmission module for carrying out not only phase control but also amplitude control in a continuous manner, while suppressing amplitude and phase variation, as well as to make a high frequency amplifier in the transmission module highly efficient.

BRIEF DESCRIPTION OF THE DRAWINGS

FIG. 6 is circuit block diagrams showing transmission modules, respectively, according to a fourth embodiment of the present invention. (Fourth Embodiment)

FIG. 10 is an explanatory view showing a data example stored in a control table in FIG. 9. (Seventh Embodiment)

FIG. 12 is an explanatory view showing a data example stored in a control table in FIG. 11. (Eighth Embodiment)

MODES FOR CARRYING OUT THE INVENTION

First Embodiment

Figure 1:
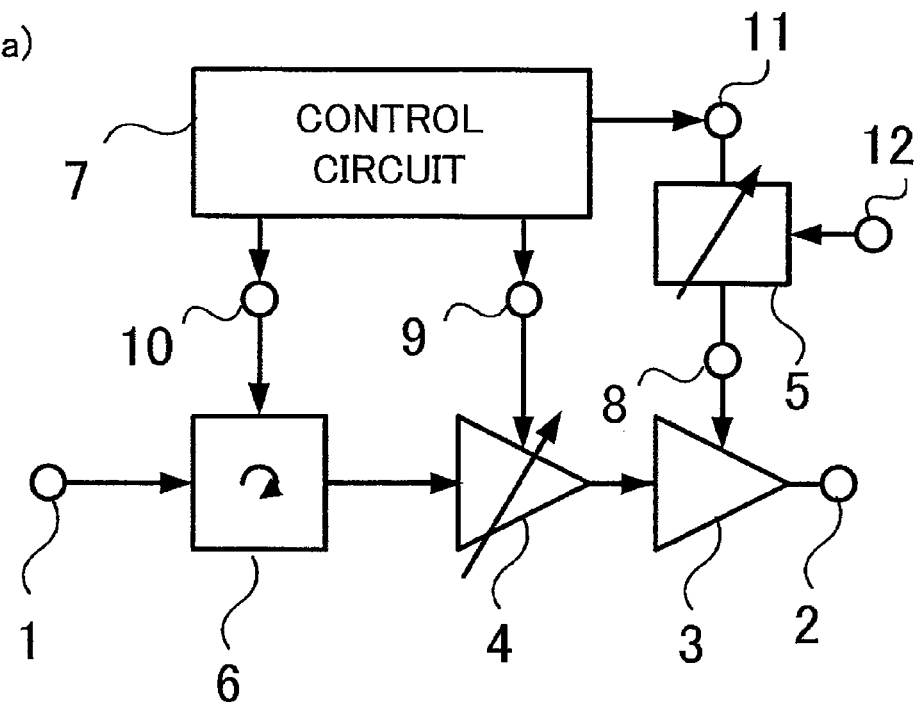
FIG. 1 is circuit block diagrams showing transmission modules, respectively, according to a first embodiment of the present invention. (First Embodiment)
Figure 1:
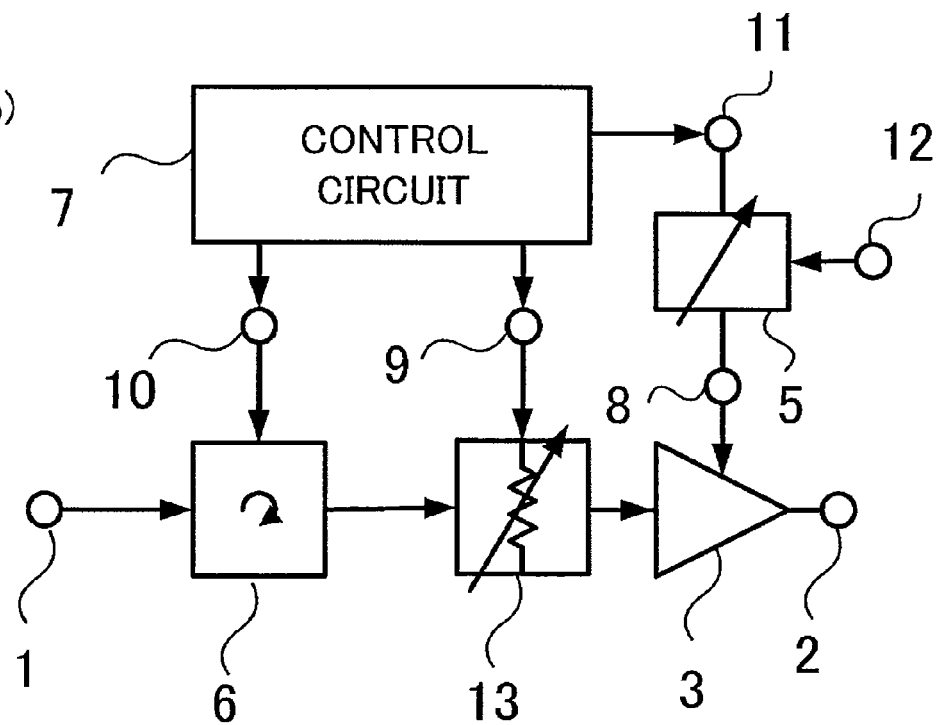

FIG. 1 is circuit block diagrams showing transmission modules, respectively, according to a first embodiment of the present invention, wherein FIG. 1(a) and FIG. 1(b) show different arrangement examples, respectively.

In FIG. 1(a), the transmission module is provided with a high frequency signal input terminal 1, a high frequency signal output terminal 2, a high frequency amplifier 3, a variable gain amplifier 4, a variable voltage source 5, a phase shifter 6, a control circuit 7, a power supply terminal 8 of the high frequency amplifier 3, a control terminal 9 of the variable gain amplifier 4 (a gain control unit, an amplitude control unit), a control terminal 10 of the phase shifter 6 (a phase control unit), a control terminal 11 of the variable voltage source 5 (a power supply voltage control unit), and a power supply terminal 12 of the variable voltage source 5.

On the other hand, in FIG. 1(b), a variable attenuator 13 is provided in place of the variable gain amplifier 4 in FIG. 1(a).

The difference between the individual circuit arrangements of FIG. 1(a) and FIG. 1(b) is only in that either one of the variable gain amplifier 4 and the variable attenuator 13 is used as a gain variable unit (an amplitude control unit).

Next, reference will be made to the operation of the transmission module as shown in FIG. 1(a). Here, the operation in the circuit arrangement of FIG. 1(a) will be described representatively, while omitting the description of operation in similar FIG. 1(b).

A high frequency signal inputted from the high frequency signal input terminal 1 is first controlled in phase by the phase shifter 6, and then in amplitude by the variable gain amplifier 4, after which it is amplified up to a required output power level by the high frequency amplifier 3, and is outputted from the high frequency signal output terminal 2. As a result of this, not only the phase of the high frequency signal but also the amplitude thereof can be controlled.

A power supply voltage for the high frequency amplifier 3 is supplied from the variable voltage source 5 through the power supply terminal 8 of the high frequency amplifier 3. In addition, the power supply voltage is generated based on a voltage applied from the power supply terminal 12 of the variable voltage source 5, and is controlled by the control circuit 7 through the control terminal 11 of the variable voltage source.

Here, it is assumed that the input output characteristics (including the value of the output voltage) of the high frequency amplifier 3 are stored in advance in the control circuit 7 as known data values.

The pass phase of the phase shifter 6 is controlled by the control circuit 7 through the control terminal 10 of the phase shifter 6 (the phase control unit).

Similarly, the gain of the variable gain amplifier 4 is controlled by the control circuit 7 through the control terminal 9 of the variable gain amplifier 4 (the gain control unit, the amplitude control unit).

Figure 2:
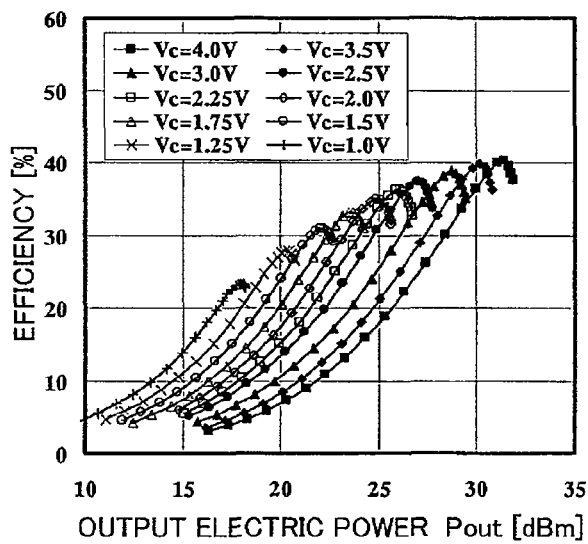
FIG. 2 is explanatory views showing the measurement results of input output characteristics at the time of change of a power supply voltage in the first embodiment of the present invention. (First Embodiment)
Figure 2:
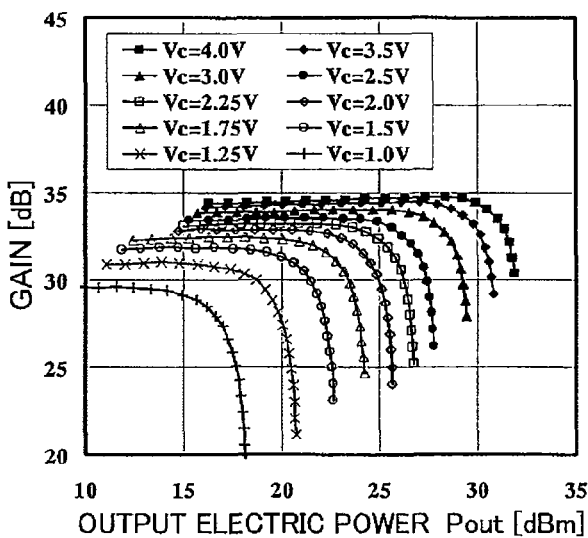
Figure 2:
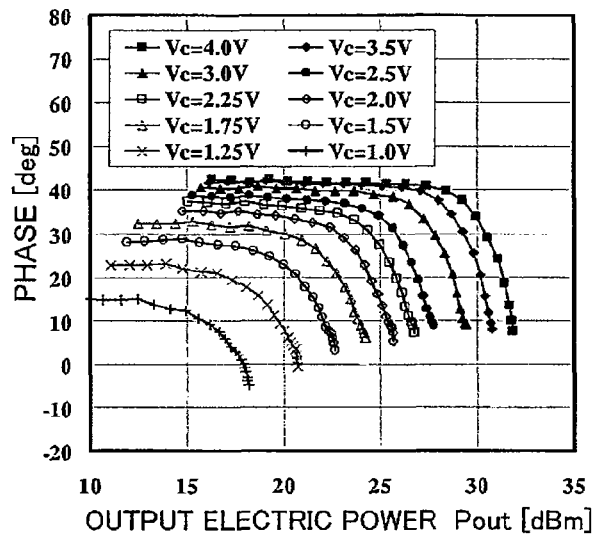

FIG. 2 is explanatory views showing the measurement results of the input output characteristics of the high frequency amplifier 3 (a three-stage amplifier), wherein FIG. 2(a) shows the output power dependence of the efficiency [%], FIG. 2(b) shows the output power dependence of the gain [dB], and FIG. 2(c) shows the output power dependence of the pass phase [deg], respectively.

In FIG. 2(a) through FIG. 2(c), the axis of abscissa represents output power Pout [dBm], and herein, individual measurement results at the time of changing all the power supply voltages Vc [V] for the three-stage amplifier in the range of 1V-4V are shown. Here, note that the test frequency is 2.5 GHz.

In FIG. 2(a), when the power supply voltage Vc is made low so that the characteristic curve shifts to the left side, the output power Pout at which efficiency becomes a maximum (a local maximum) becomes low.

Accordingly, in the transmission module shown in FIG. 1(a), it can be seen that by controlling the transmission module in such a manner that the lower the output power Pout of the high frequency amplifier 3 in the transmission module, the lower becomes the power supply voltage, it is possible to enhance the efficiency of the high frequency amplifier 3.

That is, in the phased array antenna apparatus, in cases where an amplitude distribution is given to the output signal of each element antenna, in a transmission module which is connected to an element antenna having a small output power, by controlling the transmission module in such a manner that the power supply voltage becomes lower in accordance with the decreasing the output power of the high frequency amplifier 3 in the transmission module, the efficiency of the high frequency amplifier 3 can be enhanced, thereby making it possible to reduce the electric power consumption of the phased array antenna apparatus.

On the other hand, in FIG. 2(b) and FIG. 2(c), the gain and the pass phase of the high frequency amplifier 3 change in accordance with the change of the power supply voltage Vc, and hence, it can be seen that an amplitude error and a phase error occur with respect to other transmission modules which construct the phased array antenna apparatus.

However, in the transmission module of FIG. 1(a), the gain change due to the change of the power supply voltage of the high frequency amplifier 3 can be compensated by controlling the variable gain amplifier 4 (the amplitude control unit) by means of the control circuit 7 through the control terminal 9 of the variable gain amplifier 4 (the gain control unit).

Similarly, the pass phase change due to the change of the power supply voltage of the high frequency amplifier 3 can be compensated by controlling the phase shifter 6 (the phase control unit) by means of the control circuit 7 through the control terminal 10 of the phase shifter 6 (the phase control unit).

As a result, it is possible to reduce the amplitude error and the phase error with respect to the other transmission modules which construct the phased array antenna apparatus.

Figure 3:
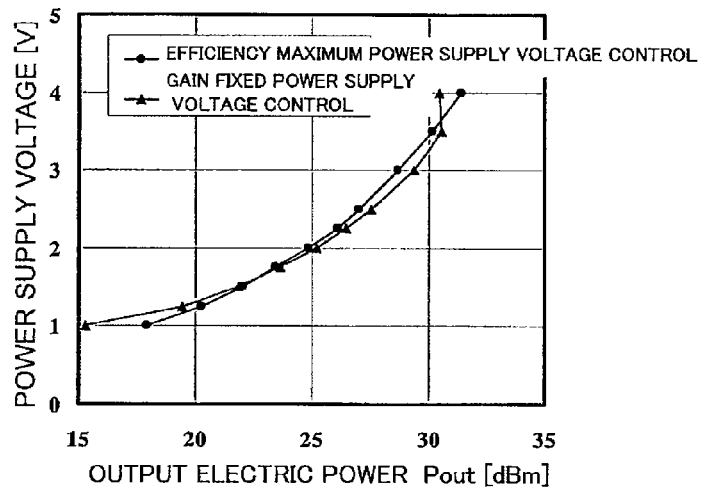
FIG. 3 is explanatory views showing the output power dependence in the first embodiment of the present invention.
Figure 3:
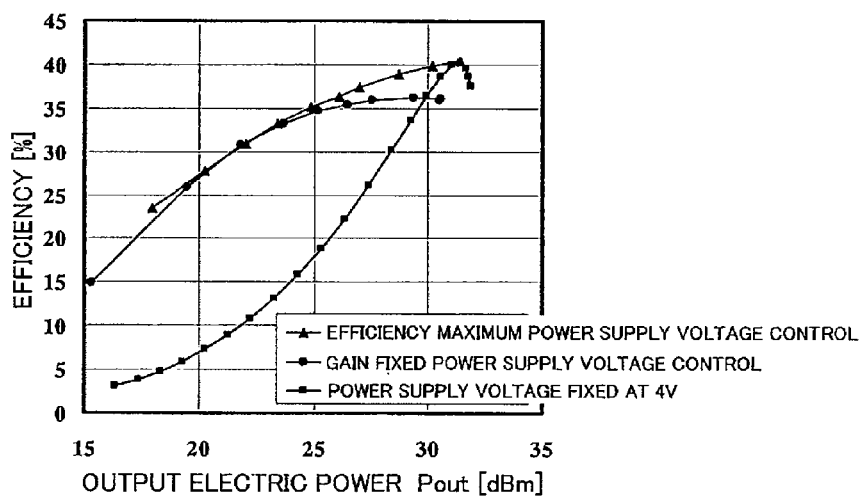
Figure 3:
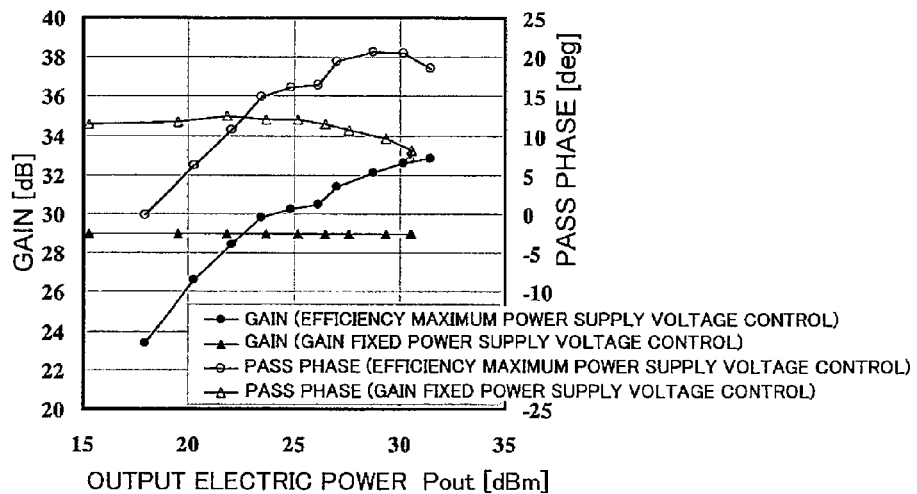

FIG. 3 is explanatory views showing output power dependences, wherein FIG. 3(a) shows the output power dependence of the power supply voltage Vc [V], FIG. 3(b) shows the output power dependence of the efficiency [%], and FIG. 3(c) shows the output power dependences of the gain and the pass phase [deg], respectively.

In FIG. 3(a) through FIG. 3(c), there are shown the output power dependences in the case where "the efficiency maximum power supply voltage control (to control the power supply voltage in accordance with the output power so as to maximize the efficiency of the high frequency amplifier 3)" is carried out based on FIG. 2 (measurement result data of the input output characteristics of the three-stage amplifier at the time of changing the power supply voltage Vc), and in the case where "gain fixed (constant) power supply voltage control (to control the power supply voltage in accordance with the output power so as to make the gain of the high frequency amplifier 3 to be constant at 29 [dB])" is carried out.

In FIG. 3(b), together with the above, there is also shown the output power dependence of efficiency [%] in the case where the power supply voltage Vc is not controlled in a variable manner but fixed at 4 V (refer to a characteristic curve denoted by black squares).

As will be clear from FIG. 3(b), it can be seen that in cases where the output power Pout is low, the efficiency becomes high to a substantial extent even in the efficiency maximum power supply voltage control (a characteristic curve of black triangles) as well as in the gain fixed power supply voltage control (a characteristic curve of black dots), as compared with the case where the power supply voltage Vc is not controlled (i.e., the characteristic curve of black squares).

Accordingly, in the transmission module of FIG. 1(a), by controlling the power supply voltage of the high frequency amplifier 3 in such a manner that the efficiency thereof becomes a maximum in accordance with the output power, or by controlling the power supply voltage of the high frequency amplifier 3 in such a manner that the gain thereof becomes fixed or constant, the efficiency of the high frequency amplifier 3 in the transmission module can be made high.

In addition, in FIG. 3(c) (the output power dependences of the gain and the pass phase, it can be seen that in cases where the power supply voltage Vc of the three-stage amplifier (the high frequency amplifier 3) is controlled so that the gain thereof becomes constant or fixed (the characteristic curve of black triangles), the gain becomes constant or fixed, and at the same time, the change of the pass phase is also suppressed small to a large extent, in comparison with the case where the power supply voltage Vc of the three-stage amplifier is controlled in accordance with the output power Pout so that the efficiency [%] thereof becomes a maximum (the characteristic curve of black dots.

Accordingly, in the transmission module of FIG. 1(a), by controlling the power supply voltage of the high frequency amplifier 3 so that the gain thereof becomes constant in accordance with the output power, the gain of the high frequency amplifier 3 can be made constant, and the change of the pass phase thereof can also be made small.

As a result of this, in cases where it is assumed that the amplitude and the phase of the input signal to the transmission module do not change, when the power supply voltage of the high frequency amplifier 3 is changed in accordance with the change of the output power thereof, the change in the gain of the high frequency amplifier 3 does not occur, and hence, the gain of the variable gain amplifier 4 (the amplitude control unit) should just be controlled so as to be linear in accordance with the output power, thus making it possible to simplify the control.

In addition, the change in the pass phase of the high frequency amplifier 3 can also be suppressed to be small, so that the control range of the phase shifter 6 (the phase control unit) also becomes small, thus making it possible to control the phase thereof with a high degree of accuracy.

Moreover, the control with respect to the phase can be made unnecessary, depending on an amplitude error and a phase error which are obtained with respect to a signal outputted from each of the element antennas of the phased array antenna.

In the foregoing, the effects obtained by the transmission module of FIG. 1(a) have been described, but with respect to a transmission module of FIG. 1(b), too, its different in comparison with the transmission module of FIG. 1(a) is only in that the variable attenuator 13 is used as the gain variable unit (the amplitude control unit), instead of the variable gain amplifier 4, and hence, it goes without saying that the same operational effects as those in the transmission module of FIG. 1(a) are achieved.

Further, in the transmission modules of FIG. 1(a) and FIG. 1(b), a DC-DC converter is assumed as the variable voltage source 5, and the control terminal 11 and the power supply terminal 12 are provided for the variable voltage source 5 which serves to supply a voltage to the power supply terminal 8 of the high frequency amplifier 3, but it may also be constructed such that a voltage, which becomes a reference voltage, is generated inside the variable voltage source 5, without the provision of the power supply terminal 12 of the variable voltage source 5.

As described above, the transmission module according to the first embodiment (FIG. 1) of the present invention is provided with the high frequency amplifier 3, the amplitude control unit (the variable gain amplifier 4, the variable attenuator 13) that sets the gain of an input signal to the high frequency amplifier 3 in a variable manner, the phase shifter 6 (the phase control unit) that sets the phase of the input signal to the high frequency amplifier 3 in a variable manner, the variable power source 5 (the power supply voltage control unit) that sets a power supply voltage to the high frequency amplifier 3 in a variable manner, and the control circuit 7 that controls the amplitude control unit, the phase control unit and the power supply voltage control unit, wherein the control circuit 7 and the variable voltage source 5 (the power supply voltage control unit) control the power supply voltage in accordance with the output power of the high frequency amplifier 3.

The control circuit 7 controls the amplitude control unit (the variable gain amplifier 4, the variable attenuator 13) and the phase shifter 6 (the phase control unit) in such a manner as to compensate for the individual changes in the gain and the pass phase of the high frequency amplifier 3, which are generated in accordance with the change of the power supply voltage.

In addition, the control circuit 7 and the variable voltage source 5 (the power supply voltage control unit) control the power supply voltage so that the gain of the high frequency amplifier 3 becomes constant.

The variable voltage source 5 (the power supply voltage control unit) includes the DC-DC converter; the amplitude control unit includes the variable gain amplifier 4 in FIG. 1(a), or the variable attenuator 13 in FIG. 1(b); and the phase control unit includes the phase shifter 6.

According to this, in a phased array antenna apparatus, it is possible to achieve a transmission module for carrying out not only phase control but also amplitude control in a continuous manner.

In addition, variations in the amplitude and the phase of the high frequency amplifier 3 in the transmission module can be suppressed, thereby making it possible to achieve high efficiency.

Moreover, it is possible to achieve a large directional gain, a low side lobe level and a low power consumption, as a phased array antenna apparatus using a transmission module.

Second Embodiment

Figure 4:
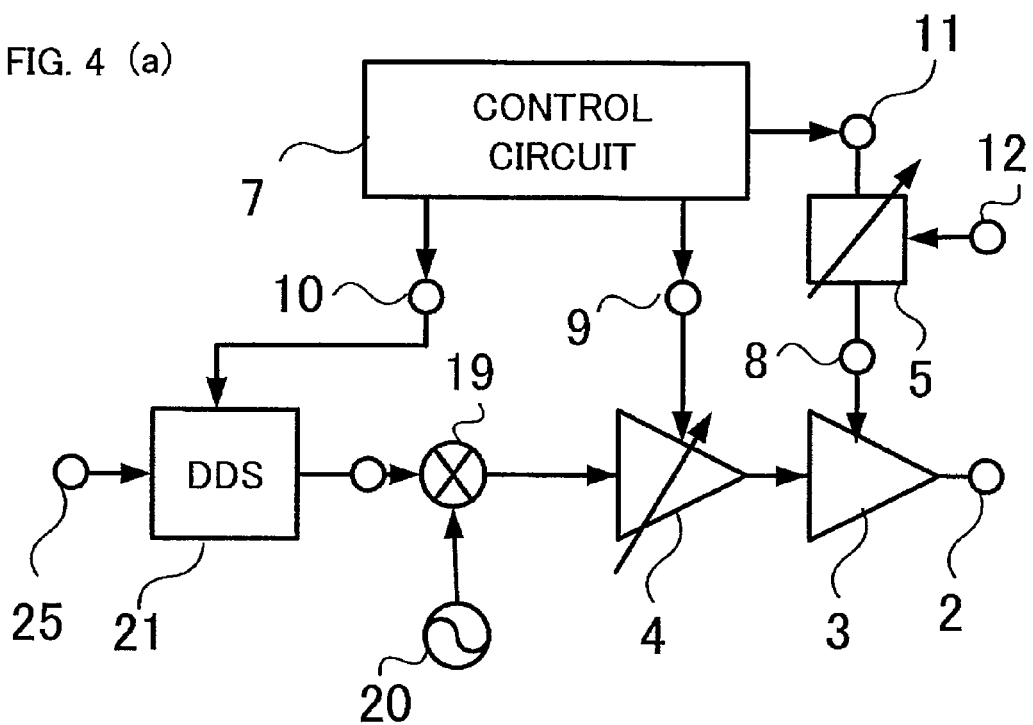
FIG. 4 is circuit block diagrams showing transmission modules, respectively, according to a second embodiment of the present invention. (Second Embodiment)
Figure 4:
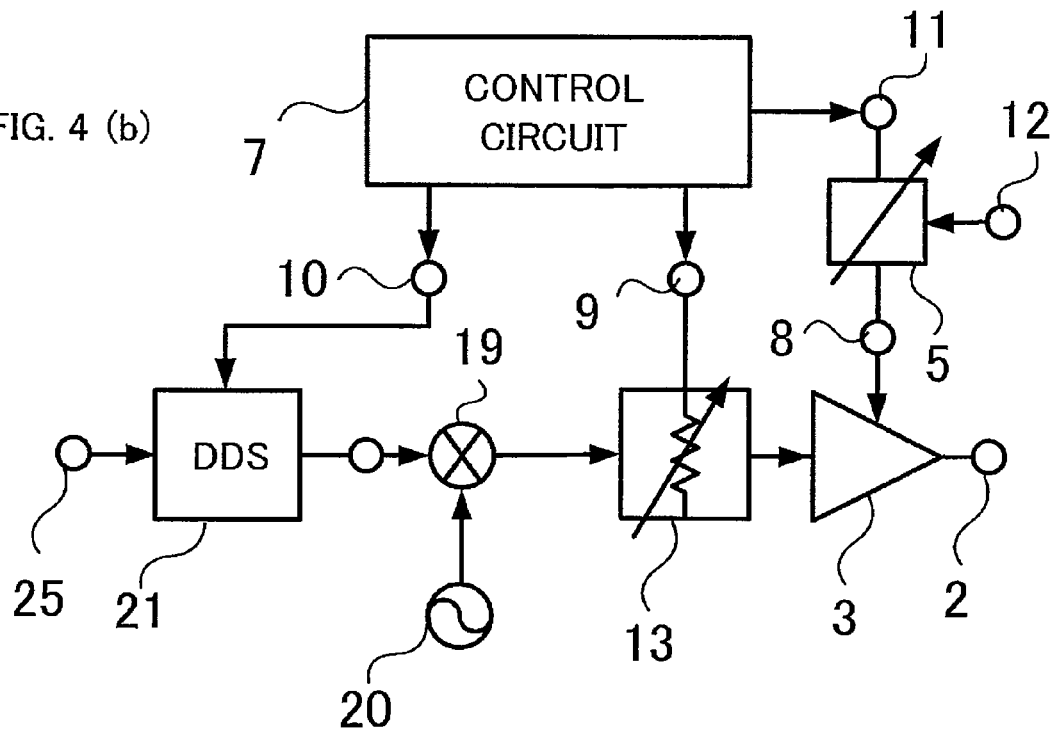

Here, note that in the above-mentioned first embodiment (FIG. 1), the phase shifter 6 has been used as the phase control unit, but in place of the phase shifter 6, there may be used a frequency converter 19, an oscillator 20 and a DDS (direct digital synthesizer) 21, as shown in FIG. 4.

FIG. 4 is circuit block diagrams showing transmission modules, respectively, according to a second embodiment of the present invention, wherein those which are similar to the aforementioned ones (see FIG. 1) are denoted by the same reference numerals and characters as those in the aforementioned ones, while omitting a detailed explanation thereof.

FIG. 4(a) and FIG. 4(b) show different arrangement examples, respectively, wherein the difference between the individual circuit arrangements is only in that either one of the variable gain amplifier 4 and the variable attenuator 13 is used as a gain variable unit (an amplitude control unit).

In FIG. 4(a), the transmission module is provided with a baseband digital signal input terminal 25, in place of the above-mentioned high frequency signal input terminal 1, and is also provided, instead of the above-mentioned phase shifter 6, with the frequency converter 19 connected to an input side of the variable gain amplifier 4 (the amplitude control unit), the oscillator 20 connected to the frequency converter 19, and the DDS 21 connected to an input side of the frequency converter 19.

In FIG. 4(a), its difference from the above-mentioned FIG. 1(a) is in that an input signal is a baseband digital signal instead of a high frequency signal, and in that the frequency converter 19, the oscillator 20 and the DDS 21 are used as the phase control unit, in place of the phase shifter 6.

In this case, the input signal (baseband digital signal) is converted into an analog baseband signal by means of the DDS 21, which is then mixed with a local signal, which is generated by the oscillator 20, by means of the frequency converter 19, so that a high frequency signal is thereby generated.

In addition, the DDS 21 is controlled by means of the control circuit 7 through the control terminal 10 of the phase control unit, so that it controls the pass phase.

In the transmission module of FIG. 4(b), too, it operates in a manner similar to that of FIG. 4(a), similarly as stated above. Accordingly, in the second embodiment of the present invention shown in FIG. 4(a) and FIG. 4(b), too, the same operational effects as those in the above-mentioned first embodiment can be achieved.

As described above, according to the second embodiment (FIG. 4) of the present invention, the phase control unit includes the oscillator 20, the frequency converter 19 connected to the input side of the amplitude control unit, and the DDS 21 connected to the input side of the frequency converter 19, wherein an input signal for the high frequency amplifier 3 is generated by carrying out frequency conversion of the baseband signal generated in the DDS 21 by the use of the local signal generated by the oscillator 20 and the frequency converter 19, thus making it possible to achieve the same operational effects as mentioned above.

In addition, because phase control is carried out in the DDS 21, it becomes possible to perform digital control therein, and the analog phase shifter 6 becomes unnecessary, thus making it possible to achieve a reduction in size.

Third Embodiment

Figure 5:
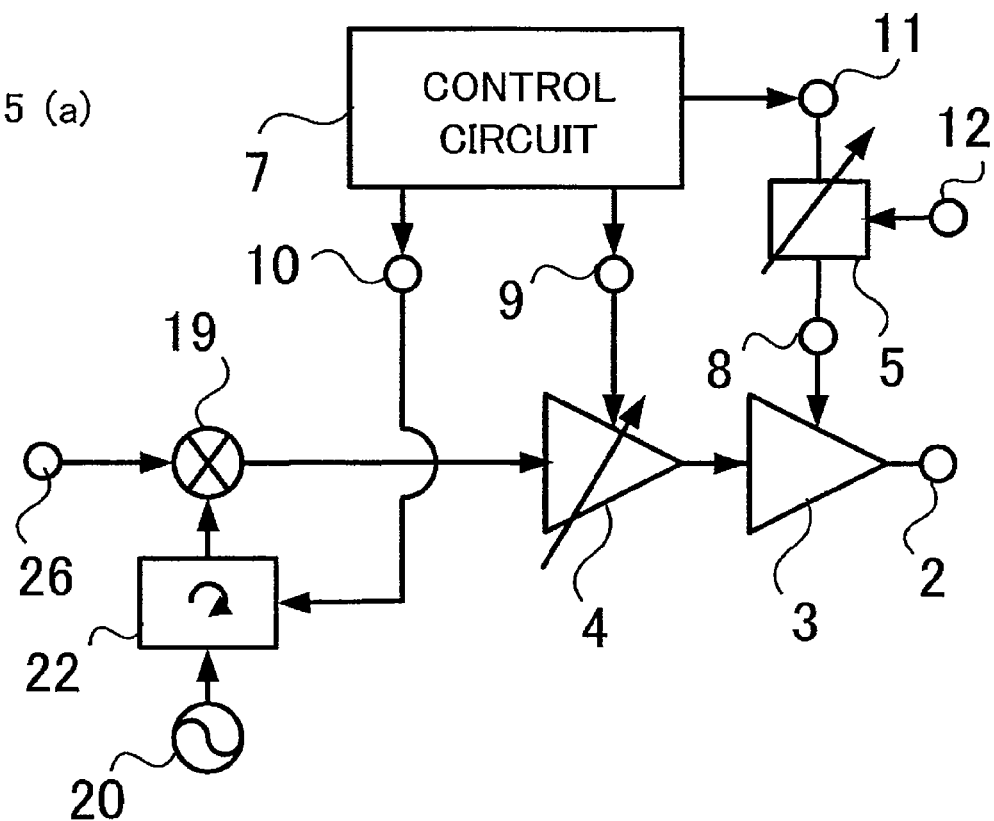
FIG. 5 is circuit block diagrams showing transmission modules, respectively, according to a third embodiment of the present invention. (Third Embodiment)
Figure 5:
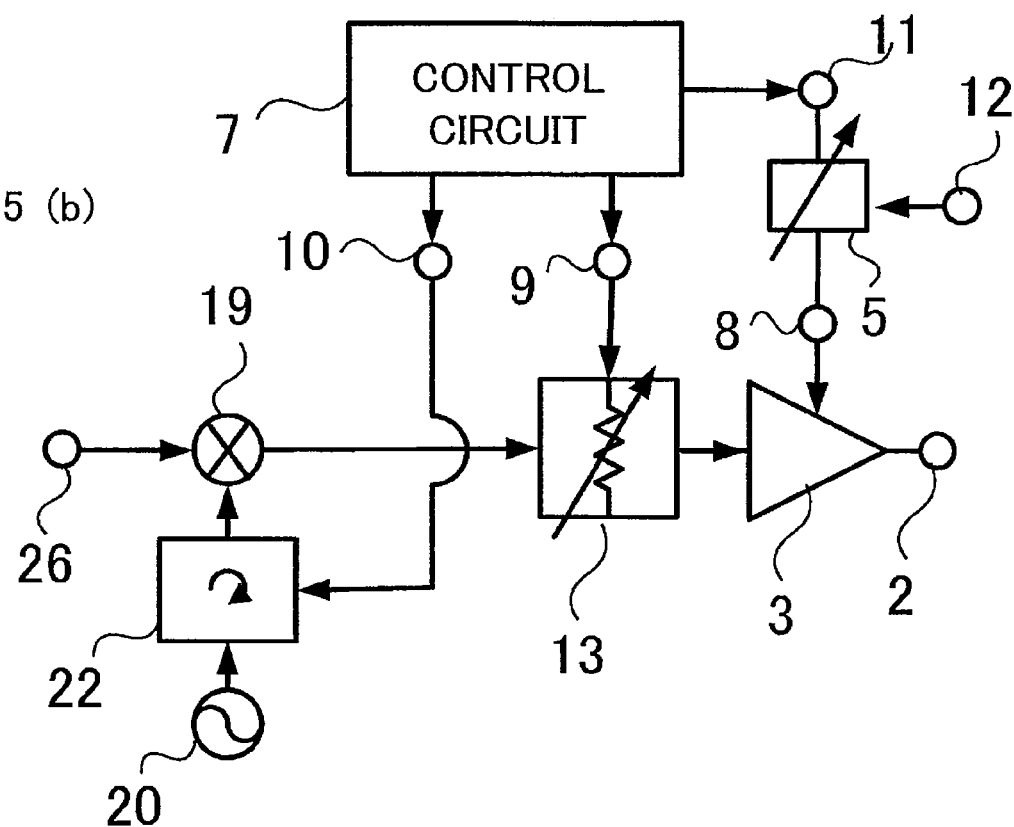

Here, note that in the above-mentioned second embodiment (FIG. 4), the DDS 21 has been used in the phase control unit, but in place of the DDS 21, there may be used a phase shifter 22 which is inserted between the frequency converter 19 and the oscillator 20, as shown in FIG. 5.

FIG. 5 is circuit block diagrams showing transmission modules, respectively, according to a third embodiment of the present invention, wherein those which are similar to the aforementioned ones (see FIG. 4) are denoted by the same reference numerals and characters as those in the aforementioned ones, while omitting a detailed explanation thereof.

FIG. 5(a) and FIG. 5(b) show different arrangement examples, respectively, wherein the difference between the individual circuit arrangements is only in that either one of the variable gain amplifier 4 and the variable attenuator 13 is used as a gain variable unit (an amplitude control unit).

In FIG. 5(a), the transmission module is provided with a baseband analog signal input terminal 26, in place of the above-mentioned baseband digital signal input terminal 25, and is also provided with the phase shifter 22 that is inserted between the frequency converter 19 and the oscillator 20, in place of the above-mentioned DDS 21.

In FIG. 5(a), its difference from the above-mentioned FIG. 4(a) is in that an input signal is not a baseband digital signal but instead a baseband analog signal, and in that the phase shifter 22 is used in the phase control unit, in place of the DDS 21.

In this case, the frequency converter 19 generates a high frequency signal by mixing the input signal (baseband analog signal) with the local signal generated by the oscillator 20.

In addition, the phase shifter 22 arranged between the oscillator 20 and the frequency converter 19 is controlled by the control circuit 7 through the control terminal 10 of the phase control unit, so that it controls the phase of the local signal from the oscillator 20 thereby to control the pass phase of the transmission module.

Accordingly, in the third embodiment of the present invention shown in FIG. 5(a) and FIG. 5(b), too, the same operational effects as those in the above-mentioned first embodiment can be achieved.

As described above, according to the third embodiment (FIG. 5) of the present invention, the phase control unit includes the oscillator 20, the frequency converter 19 connected to the input side of the amplitude control unit, and the phase shifter 22 inserted between the oscillator 20 and the frequency converter 19, wherein an input signal for the high frequency amplifier is generated by carrying out frequency conversion of the baseband signal inputted to the frequency converter 19 by the use of the local signal generated by the oscillator 20 and the frequency converter 19, thus making it possible to achieve the same operational effects as mentioned above.

Fourth Embodiment

Here, note that in the above-mentioned third embodiment (FIG. 5), the phase shifter 22 has been used in the phase control unit, but in place of the phase shifter 22, there may be used a second frequency converter 23 and a first DDS 24, as shown in FIG. 6.

FIG. 6 is circuit block diagrams showing transmission modules, respectively, according to a fourth embodiment of the present invention, wherein those which are similar to the aforementioned ones (see FIG. 5) are denoted by the same reference numerals and characters as those in the aforementioned ones, while omitting a detailed explanation thereof.

FIG. 6(a) and FIG. 6(b) show different arrangement examples, respectively, wherein the difference between the individual circuit arrangements is only in that either one of the variable gain amplifier 4 and the variable attenuator 13 is used as a gain variable unit (an amplitude control unit).

In FIG. 6(a), the transmission module is provided, in place of the above-mentioned phase shifter 22, with the second frequency converter 23 inserted between the first frequency converter 19 and the oscillator 20, and the first DDS 24 connected to the second frequency converter 23.

In FIG. 6(a), its difference from the above-mentioned FIG. 5(a) is in that in the phase control unit, there are used the second frequency converter 23 and the first DDS 24, in place of the phase shifter 22.

In this case, the second frequency converter 23 mixes a signal generated by the oscillator 20 and a signal generated by the first DDS 24 with each other thereby to generate a local signal.

At this time, the first DDS 24 is controlled by the control circuit 7 through the control terminal 10 of the phase control unit, so that it controls the phase of the local signal thereby to control the pass phase of the transmission module.

The first frequency converter 19 generates a high frequency signal by mixing the input signal (baseband analog signal) and the local signal from the second frequency converter 23 with each other.

Accordingly, in the fourth embodiment of the present invention shown in FIG. 6(a) and FIG. 6(b), too, the same operational effects as those in the above-mentioned third embodiment can be achieved.

As described above, according to the fourth embodiment (FIG. 6) of the present invention, the phase control unit includes the oscillator 20, the first frequency converter 19 connected to the input side of the amplitude control unit, the second frequency converter 23 inserted between the oscillator 20 and the first frequency converter 19, and the first DDS 24 connected to the second frequency converter 23, wherein by using, as the local signal, a signal obtained by carrying out frequency conversion of the individual output signals of the oscillator 20 and the first DDS 24 by means of the second frequency converter 23, an input signal for the high frequency amplifier 3 is generated by carrying out frequency conversion of the baseband signal inputted to the first frequency converter 19 by the use of the local signal and the first frequency converter 19, thus making it possible to achieve the same operational effects as those in the above-mentioned first embodiment.

In addition, because pass phase control is carried out in the DDS 24, it becomes possible to perform digital control therein, and the analog phase shifter 22 in FIG. 5 becomes unnecessary, thus making it possible to achieve a reduction in size.

Fifth Embodiment

Figure 7:
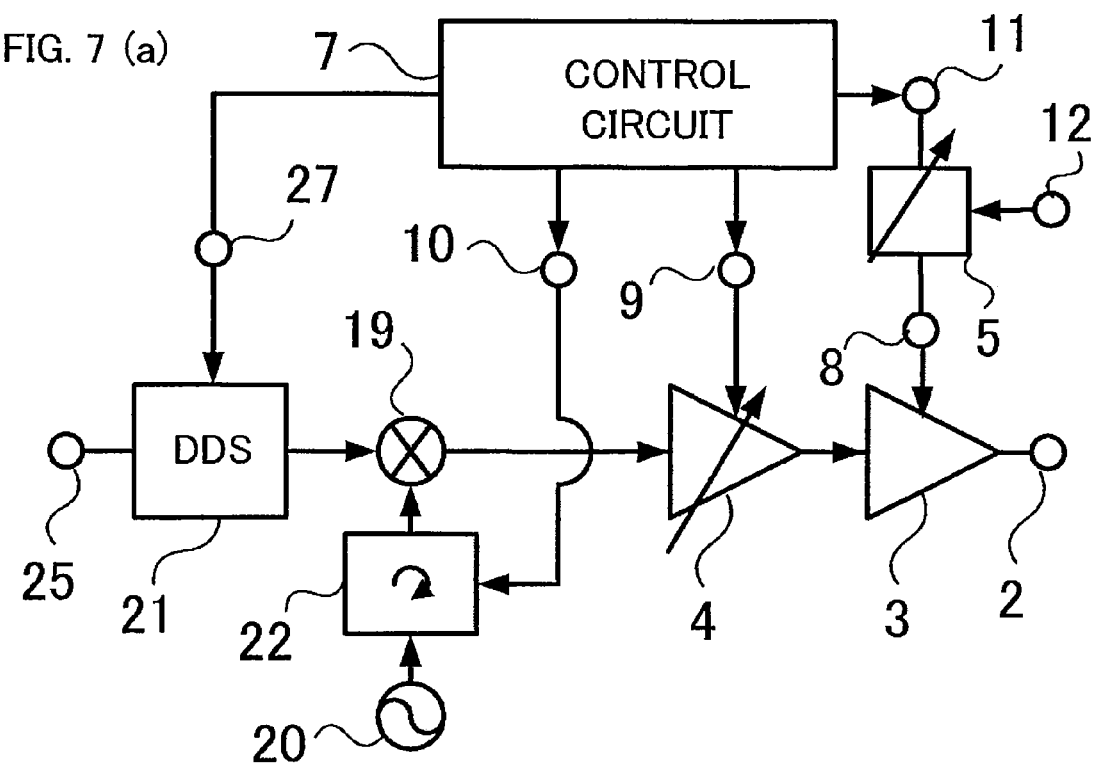
FIG. 7 is circuit block diagrams showing transmission modules, respectively, according to a fifth embodiment of the present invention. (Fifth Embodiment)
Figure 7:
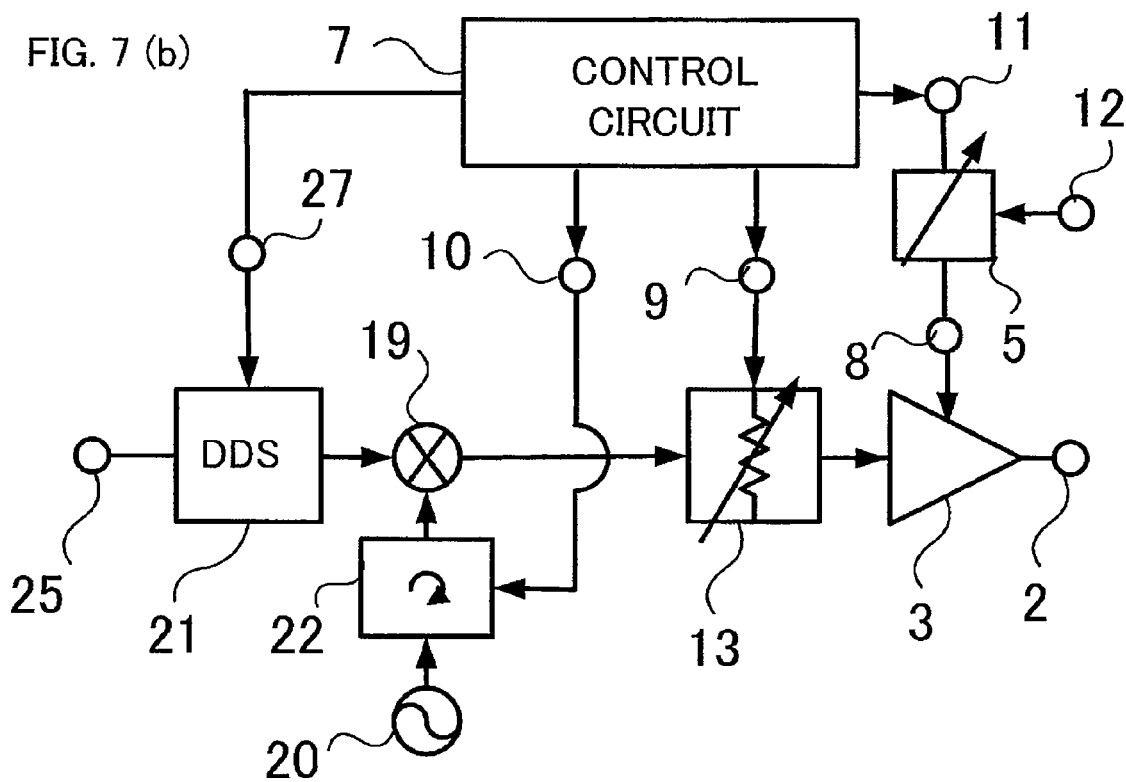

Here, note that in the above-mentioned second embodiment (FIG. 4), the DDS 21 has been used in the phase control unit, and in the above-mentioned third embodiment (FIG. 5), the phase shifter 22 has been used in the phase control unit, but both the DDS 21 and the phase shifter 22 may be used, as shown in FIG. 7.

FIG. 7 is circuit block diagrams showing transmission modules, respectively, according to a fifth embodiment of the present invention, wherein those which are similar to the aforementioned ones (see FIG. 4 and FIG. 5) are denoted by the same reference numerals and characters as those in the aforementioned ones, while omitting a detailed explanation thereof.

FIG. 7(a) and FIG. 7(b) show different arrangement examples, respectively, wherein the difference between the individual circuit arrangements is only in that either one of the variable gain amplifier 4 and the variable attenuator 13 is used as a gain variable unit (an amplitude control unit).

In FIG. 7(a), the phase control unit of the transmission module is provided with the frequency converter 19, the oscillator 20, the DDS 21, the phase shifter 22, the baseband digital signal input terminal 25, and a control terminal 27 of a second phase control unit which is added separately from a first control terminal 10.

In FIG. 7(a), its difference from the above-mentioned FIG. 5(a) is in that a baseband analog signal is generated by means of the DDS 21, using as an input signal a baseband digital signal in the phase control unit, in place of a baseband analog signal.

In addition, in this case, as a phase control unit, there are provided a first phase control unit for beam forming of a phased array antenna apparatus, and the second phase control unit for compensating for a change of a pass phase generated in the high frequency amplifier 3.

That is, the first phase control unit required for beam forming includes the phase shifter 22 arranged between the oscillator 20 and the frequency converter 19, and the phase shifter 22 is controlled by the control circuit 7 through the control terminal 10 of the first phase control unit, so that it controls the phase of the local signal thereby to control the pass phase of the transmission module.

On the other hand, the second phase control unit for compensating for a change of the pass phase generated in the high frequency amplifier 3 includes the DDS 21, and the DDS 21 performs control by means of the control circuit 7 through the control terminal 27 of the second phase control unit.

As described above, the phase control unit according to the fifth embodiment (FIG. 7) of the present invention includes, in addition to the arrangements of the above-mentioned third embodiment (FIG. 5), the DDS 21 that is connected to an input side of the frequency converter 19 and generates a baseband signal, wherein the DDS 21 is used in order to compensate for the change of the pass phase generated in the high frequency amplifier 3, and the phase shifter 22 is used for the beam forming of the phased array antenna apparatus. As a result, it is possible to achieve the same operational effects as those in the above-mentioned third embodiment.

In addition, due to the provision of the first phase control unit for beam forming and the second phase control unit for compensating for a change of a pass phase generated in the high frequency amplifier 3, which are arranged separately from each other, in cases where a reception module and a local signal source are shared or made common in the phased array antenna apparatus, beam forming can be carried out for both transmission and reception.

Sixth Embodiment

Figure 8:
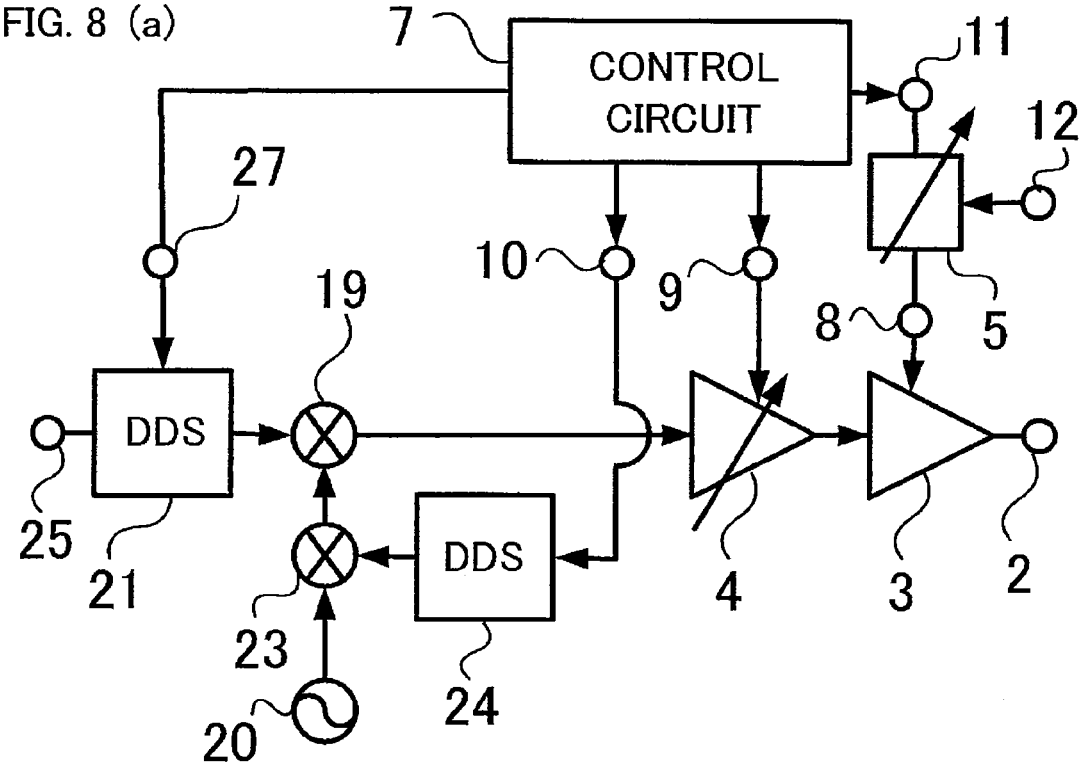
FIG. 8 is circuit block diagrams showing transmission modules, respectively, according to a sixth embodiment of the present invention. (Sixth Embodiment)
Figure 8:
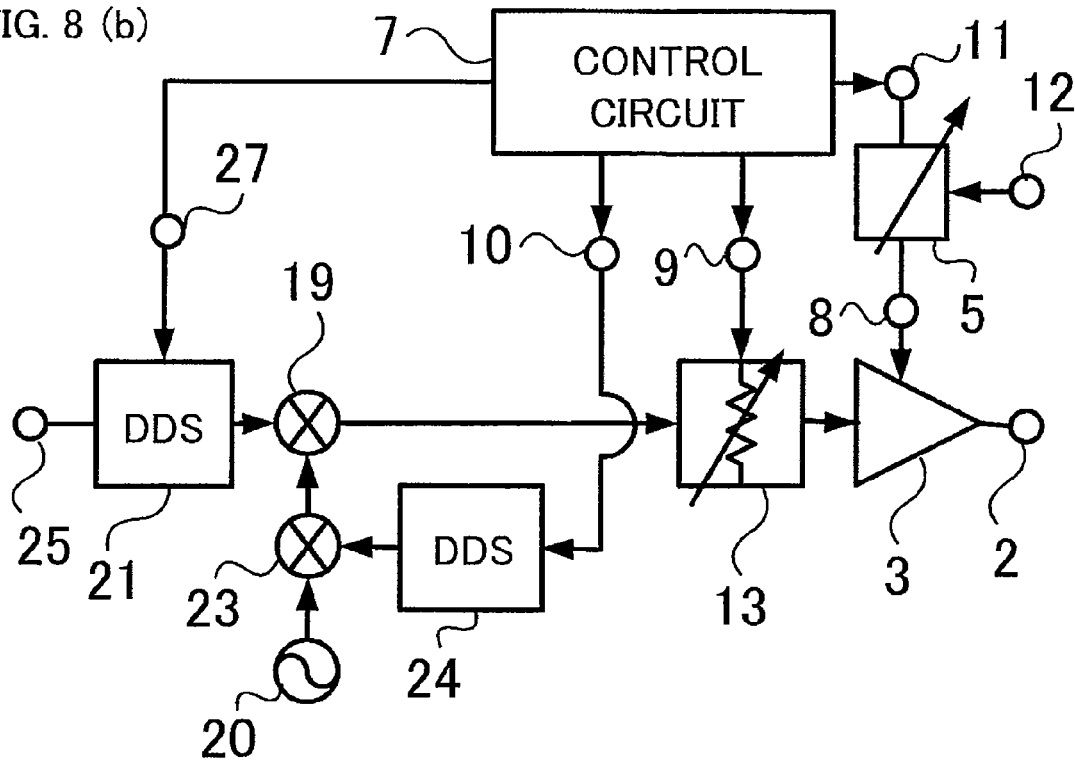

Here, note that in the above-mentioned fourth embodiment (FIG. 6), the first DDS 24 has been arranged in the second frequency converter 23 in the phase control unit, but a second DDS 21 may be further provided at an input side of the first frequency converter 19, as shown in FIG. 8.

FIG. 8 is circuit block diagrams showing transmission modules, respectively, according to a sixth embodiment of the present invention, wherein those which are similar to the aforementioned ones (see FIG. 4 and FIG. 6) are denoted by the same reference numerals and characters as those in the aforementioned ones, while omitting a detailed explanation thereof.

FIG. 8(a) and FIG. 8(b) show different arrangement examples, respectively, wherein the difference between the individual circuit arrangements is only in that either one of the variable gain amplifier 4 and the variable attenuator 13 is used as a gain variable unit (an amplitude control unit).

In FIG. 8(a), the phase control unit of the transmission module is provided with the first frequency converter 19, the oscillator 20, the second DDS 21, the second frequency converter 23, the first DDS 24, the baseband digital signal input terminal 25, and the control terminal 27 of the second phase control unit.

In FIG. 8(a), its difference from the above-mentioned FIG. 6(a) is in that in the phase control unit, a baseband analog signal is generated by means of the second DDS 21, using as an input signal a baseband digital signal in place of a baseband analog signal.

In addition, in this case, as the phase control unit, there are provided a first phase control unit for beam forming of a phased array antenna apparatus, and the second phase control unit for compensating for a change of a pass phase generated in the high frequency amplifier 3, similar to the above-mentioned fifth embodiment.

That is, the first phase control unit required for beam forming includes the first DDS 24, and the first DDS 24 is controlled by the control circuit 7 through the control terminal 10 of the phase control unit, so that it controls the phase of the local signal thereby to control the pass phase of the transmission module.

On the other hand, the second phase control unit for compensating for a change of the pass phase generated in the high frequency amplifier 3 includes the second DDS 21, and the second DDS 21 is controlled by the control circuit 7 through the control terminal 27 of the second phase control unit.

As described above, the phase control unit according to the sixth embodiment (FIG. 8) of the present invention includes, in addition to the arrangements of the above-mentioned fourth embodiment (FIG. 6), the second DDS 21 that is connected to the input side of the first frequency converter 19 and generates a baseband signal, wherein the second DDS 21 is used in order to compensate for the change of the pass phase generated in the high frequency amplifier 3, and the first DDS 24 is used for the beam forming of the phased array antenna apparatus. As a result, it is possible to achieve the same operational effects as those in the above-mentioned fourth embodiment.

In addition, due to the provision of the first phase control unit for beam forming and the second phase control unit for compensating for a change of a pass phase generated in the high frequency amplifier 3, in cases where a reception module and a local signal source are shared or made common in the phased array antenna apparatus, beam forming can be carried out for both transmission and reception.

Seventh Embodiment

Figure 9:
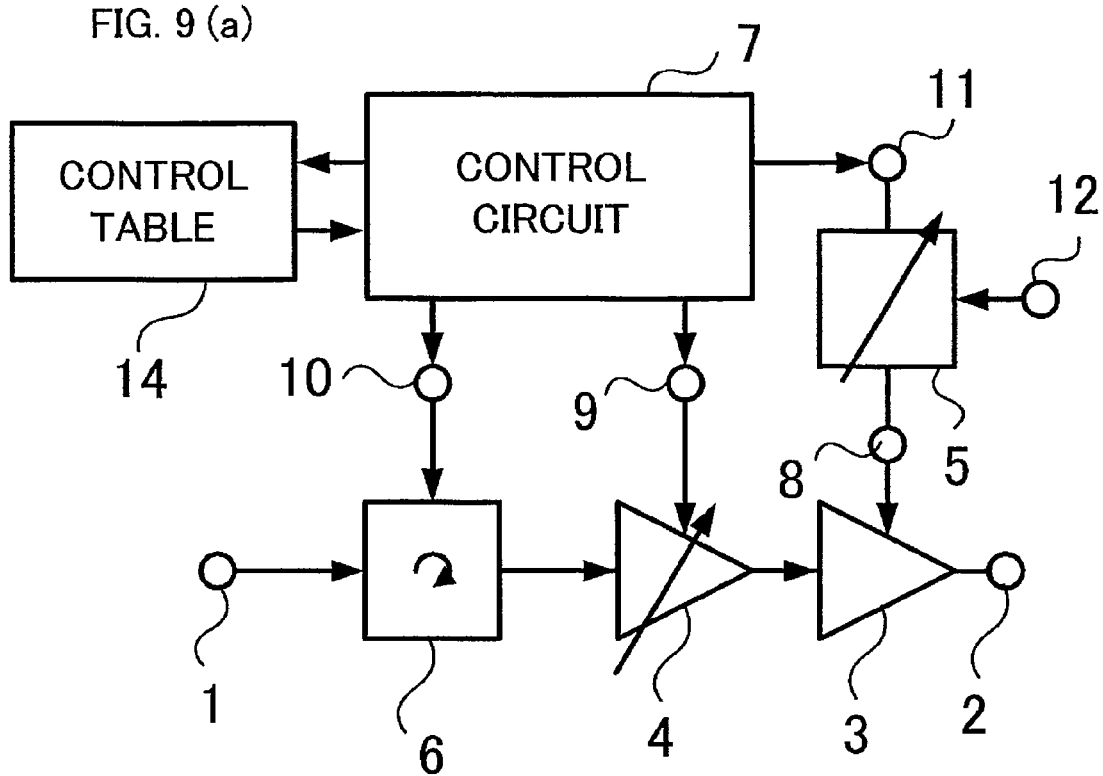
FIG. 9 is circuit block diagrams showing transmission modules, respectively, according to a seventh embodiment of the present invention. (Seventh Embodiment)
Figure 9:
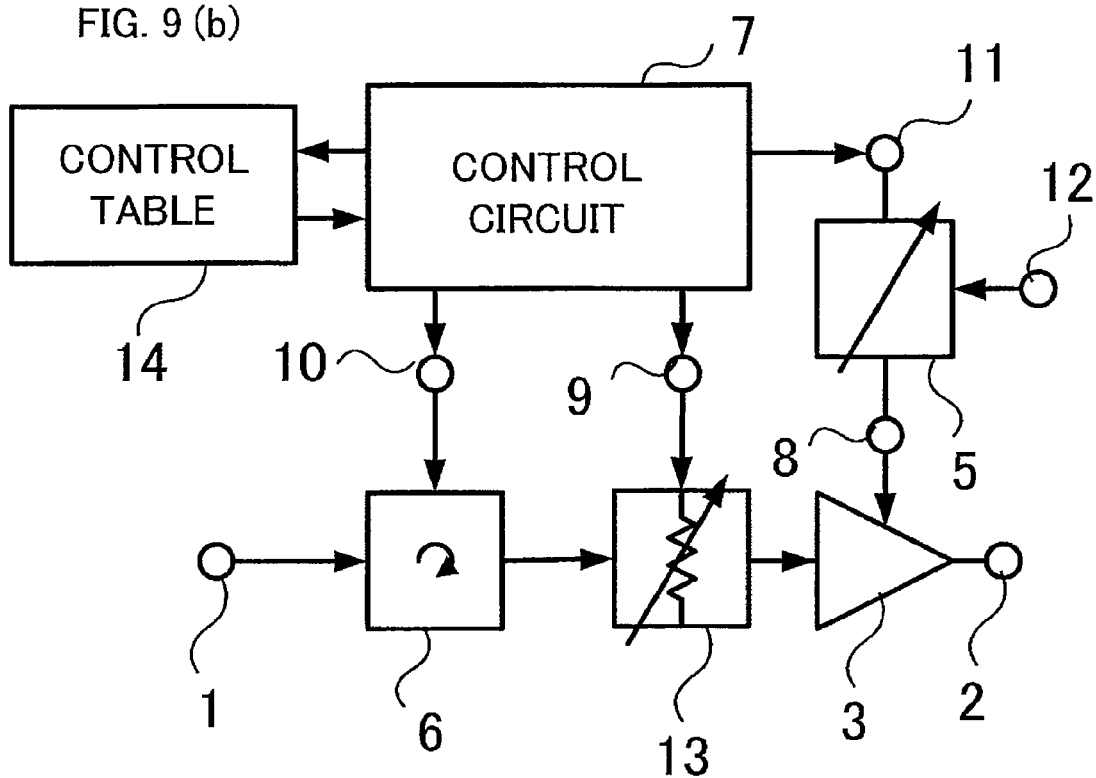

Although no specific reference has been made in the above-mentioned first through sixth embodiments (FIG. 1 through FIG. 8), it may be constructed such that a control table 14 cooperating with the control circuit 7 is arranged, as shown in FIG. 9, so that the power supply voltage, the gain, and the phase of the high frequency amplifier 3 can be controlled based on setting values in the control table 14.

FIG. 9 is circuit block diagrams showing transmission modules, respectively, according to a seventh embodiment of the present invention, wherein those which are similar to the aforementioned ones (see FIG. 1) are denoted by the same reference numerals and characters as those in the aforementioned ones, while omitting a detailed explanation thereof.

Although here are typically shown examples in which the control table 14 is added to the circuit arrangements of the first embodiment (FIG. 1), it goes without saying that the invention can be applied to the arrangements of the other embodiments (FIG. 4 through FIG. 8).

In addition, FIG. 9(a) and FIG. 9(b) show different arrangement examples, respectively, wherein the difference between the individual circuit arrangements is only in that either one of the variable gain amplifier 4 and the variable attenuator 13 is used as a gain variable unit (an amplitude control unit).

In FIG. 9(a), the transmission module is provided, in addition to the above-mentioned arrangement (FIG. 1), with the control table 14 that is connected to the control circuit 7.

The control circuit 7 cooperates with the variable voltage source 5 (the power supply voltage control unit), the variable gain amplifier 4 (the amplitude control unit) and the phase shifter 6 (the phase control unit), so that it controls the power supply voltage, the gain (amplitude) and the phase of the high frequency amplifier 3 based on a variety of kinds of setting values in the control table 14, in accordance with the output power of the high frequency amplifier 3.

FIG. 10 is an explanatory view showing a specific example of data (setting values) within the control table 14.

As shown in FIG. 10, the setting values of the voltage (power supply voltage) to be applied to the high frequency amplifier 3, the setting values of the gain of a gain change unit, and the setting values of the phase of a phase change unit, with respect to individual output powers, are stored in the control table 14 as table data.

The control circuit 7 grasps in advance the characteristics of the high frequency amplifier 3, the variable gain amplifier 4 (or the variable attenuator 13) and the phase shifter 6, which are used for the transmission module, obtains, based on the result, the setting values of individual components in which the amplitude and the pass phase of the transmission module becomes setting values, respectively, and creates the control table 14.

Hereinafter, the control circuit 7 can set the amplitude and the pass phase of the transmission module to their setting values in a highly accurate manner by controlling the individual components (various kinds of control units and various kinds of amplifier parameters) based on the control table 14.

Here, note that by providing the control table 14 for each transmission module and each environmental condition (environmental temperature, etc.), it is possible to suppress mutual variation among a plurality of transmission modules as well as variation in the amplitude and the pass phase due to changes in the environmental conditions such as temperature, etc.

As described above, the transmission modules according to the seventh embodiment (FIG. 9, FIG. 10) of the present invention are each provided, in addition to the above-mentioned arrangements (FIG. 1), with the control table 14 in which the power supply voltage setting values with respect to the output power of the high frequency amplifier 3, the gain change setting values with respect to the amplitude control unit (the variable gain amplifier 4 or the variable attenuator 13), and the phase change setting values with respect to the phase shifter 6 (the phase control unit) have been stored.

The control circuit 7 and the variable voltage source 5 (the power supply voltage control unit) control the power supply voltage based on the power supply voltage setting values within the control table 14; and the control circuit 7 and the amplitude control unit (the variable gain amplifier 4 or the variable attenuator 13) control the gain based on the gain change setting values within the control table 14; and the control circuit 7 and the phase shifter 6 (the phase control unit) control the phase based on the phase change setting values within the control table 14.

According to this, the same operational effects as those in the above-mentioned first embodiment are achieved.

In addition, in cases where the control table 14 is provided for each of the transmission modules of the above-mentioned second through sixth embodiments (FIG. 4 through FIG. 8), the same operational effects will be achieved.

Eighth Embodiment

Figure 11:
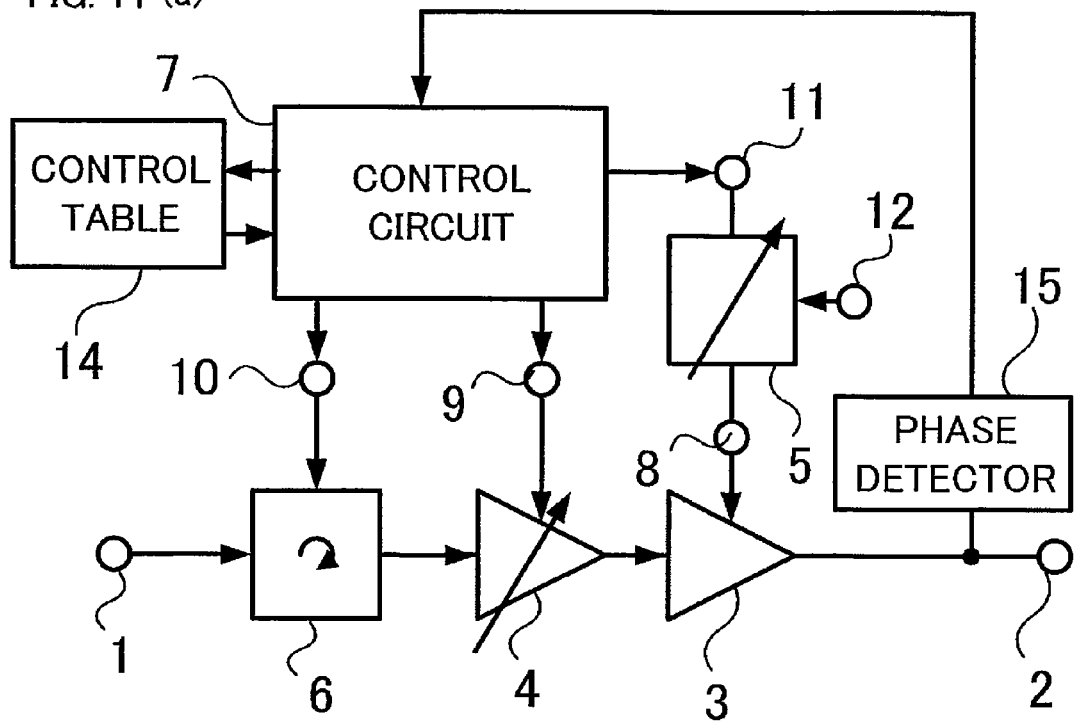
FIG. 11 is circuit block diagrams showing transmission modules, respectively, according to a eighth embodiment of the present invention. (Eighth Embodiment)
Figure 11:
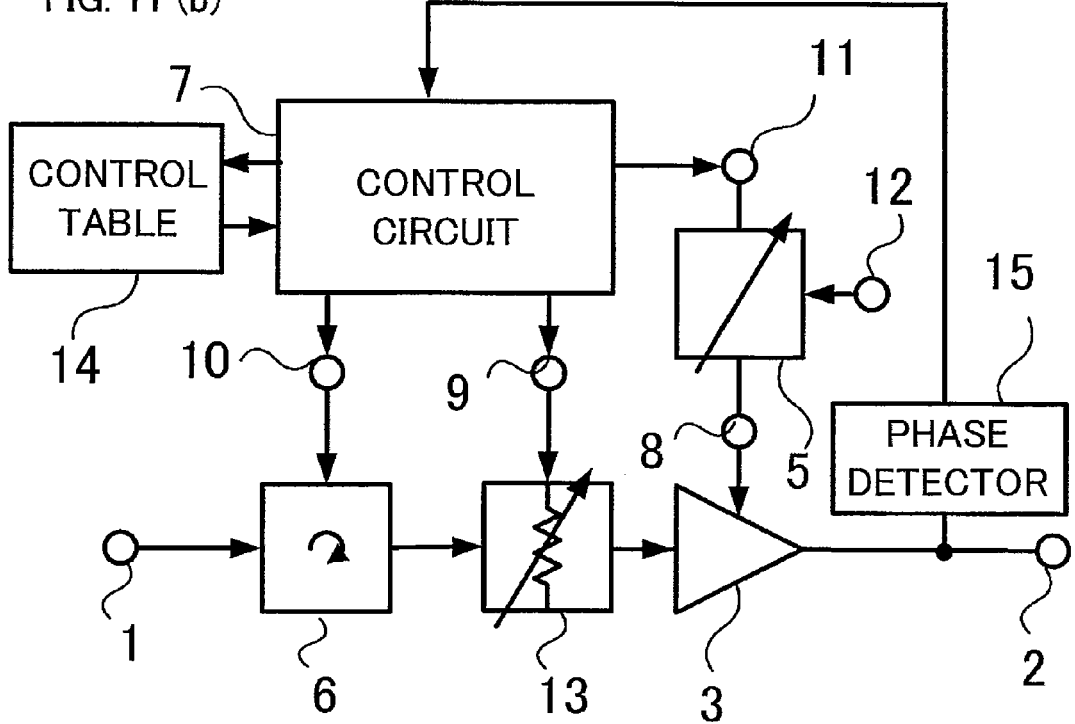

Although no specific reference has been made in the above-mentioned first through seventh embodiments (FIG. 1 through FIG. 10), it may be constructed such that a first phase detector 15 is provided which detects the phase of an output signal of the high frequency amplifier 3, as shown in FIG. 11, and the thus detected output phase information is fed back to the control circuit 7.

FIG. 11 is circuit block diagrams showing transmission modules, respectively, according to an eighth embodiment of the present invention, wherein those which are similar to the aforementioned ones (see FIG. 9) are denoted by the same reference numerals and characters as those in the aforementioned ones, while omitting a detailed explanation thereof.

Although here are typically shown examples in which the first phase detector 15 is added to the circuit arrangements of the seventh embodiment (FIG. 9), it goes without saying that the invention can be applied to the arrangements of the other embodiments (FIG. 1, FIG. 4 through FIG. 8).

In addition, FIG. 11(a) and FIG. 11(b) show different arrangement examples, respectively, wherein the difference between the individual circuit arrangements is only in that either one of the variable gain amplifier 4 and the variable attenuator 13 is used as a gain variable unit (an amplitude control unit).

In FIG. 11(a), the transmission module is provided, in addition to the above-mentioned arrangement (FIG. 9), with the first phase detector 15 that serves to detect the phase of the output signal of the high frequency amplifier 3.

In FIG. 11(a), its difference from FIG. 9(a) is in that the first phase detector 15 is provided, and in that the control circuit 7 controls a phase shift of the transmission module by controlling the phase shifter 6 (the phase control unit) through the control terminal 10 of the phase control unit, based on the output phase information detected by the first phase detector 15.

FIG. 12 is an explanatory view showing a specific example of data (setting values) within the control table 14.

As shown in FIG. 12, the setting values of the voltage (power supply voltage) to be applied to the high frequency amplifier 3, and the setting values of the gain of a gain change unit, with respect to individual output powers, are stored in the control table 14 in FIG. 11 as table data.

In this case, it is possible to perform the above control even if the setting values (refer to FIG. 10) of the phase of the phase change unit are not included in the table data, thus making it possible to reduce the size or capacity of a memory to be used for the control table 14.

As described above, according to the eighth embodiment of the present invention, the first phase detector 15 is provided which serves to detect the phase of the output signal of the high frequency amplifier 3, wherein the control circuit 7 and the phase shifter 6 (the phase control unit) control the phase based on the information on the output phase detected by the first phase detector 15. As a result, it is possible to achieve the same operational effects as those in the above-mentioned seventh embodiment.

In addition, because the phase is controlled based on the output phase information, it is possible to control the pass phase of the transmission module to a setting value with a much higher degree of accuracy.

Moreover, even if there occur an environmental change due to temperature, etc., and mutual variation among a plurality of transmission modules, it is possible to control the phase without being affected by the influence thereof.

Further, in cases where the first phase detector 15 is provided for each of the transmission modules of the above-mentioned first through sixth embodiments (FIG. 1, FIG. 4 through FIG. 8), the same operational effects will be achieved.

Ninth Embodiment

Figure 13:
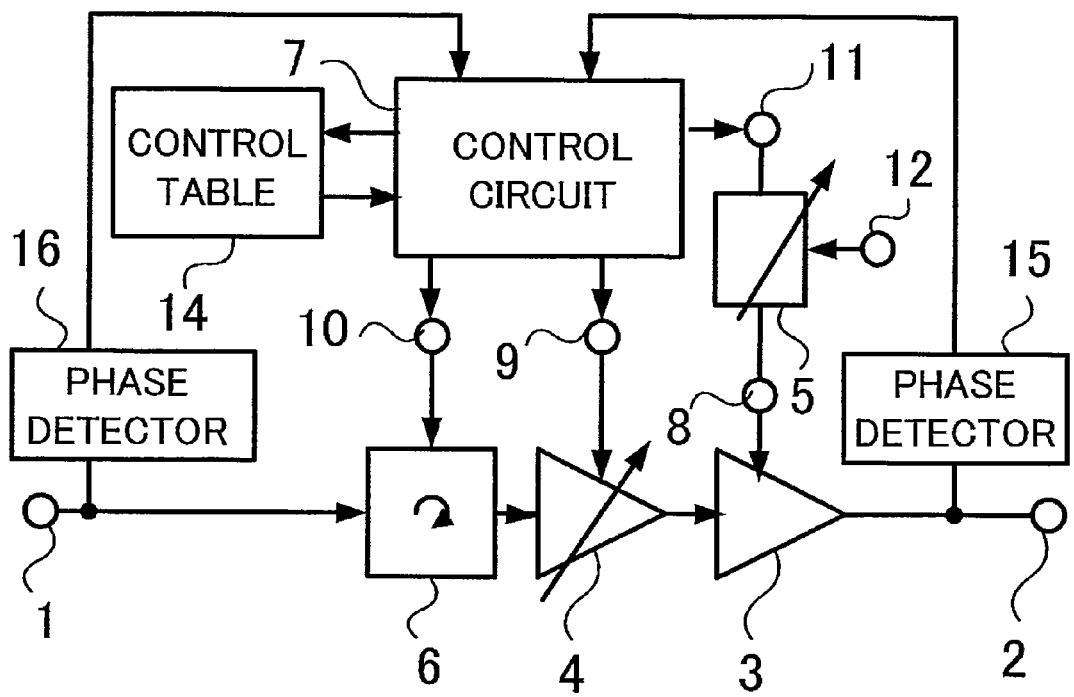
FIG. 13 is circuit block diagrams showing transmission modules, respectively, according to a ninth embodiment of the present invention. (Ninth Embodiment)
Figure 13:
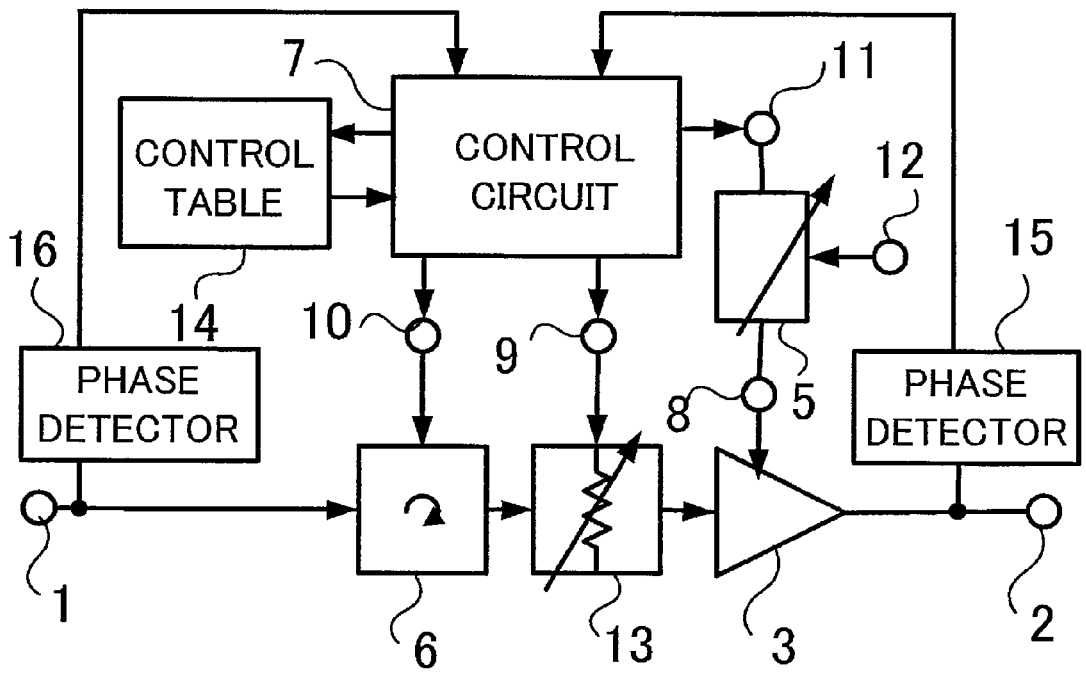

Here, note that in the above-mentioned embodiment 8 (FIG. 11), only the first phase detector 15 which serves to detect output phase information has been added, but it may be constructed such that a second phase detector 16 is further provided, as shown in FIG. 13, so that input phase information is fed back to the control circuit 7.

FIG. 13 is circuit block diagrams showing transmission modules, respectively, according to a ninth embodiment of the present invention, wherein those which are similar to the aforementioned ones (see FIG. 11) are denoted by the same reference numerals and characters as those in the aforementioned ones, while omitting a detailed explanation thereof.

Although here are typically shown examples in which the second phase detector 16 is added to the circuit arrangements of the eighth embodiment (FIG. 11), it goes without saying that the invention can be applied to the arrangements of the other embodiments (FIG. 1, FIG. 4 through FIG. 9).

FIG. 13(a) and FIG. 13(b) show different arrangement examples, respectively, wherein the difference between the individual circuit arrangements is only in that either one of the variable gain amplifier 4 and the variable attenuator 13 is used as a gain variable unit (an amplitude control unit).

In FIG. 13(a), the transmission module is provided, in addition to the above-mentioned arrangement (FIG. 11), with the second phase detector 16 that serves to detect the phase of the input signal of the high frequency amplifier 3.

In FIG. 13(a), its difference from FIG. 11(a) is only in that the second phase detector 16 to detect the phase of the input signal is provided, and that the control circuit 7 controls the phase of the transmission module by controlling the phase shifter 6 through the control terminal 10 of the phase control unit, based on the detected input and output phase information.

As described above, according to the ninth embodiment (FIG. 13) of the present invention, the second phase detector 16 to detect the phase of the input signal of the high frequency amplifier 3 is provided, in addition to the arrangements of FIG. 11, wherein the control circuit 7 and the phase shifter 6 (the phase control unit) control the phase based on the output phase information and the input phase information detected by the first and second phase detectors 15, 16. As a result, it is possible to achieve the same operational effects as those in the above-mentioned eighth embodiment.

In addition, by detecting not only the phase of the output signal but also the phase of the input signal, the information on the pass phase of the transmission module is obtained from the input and output phases, so that phase control is carried out based on the information on the pass phase. As a result, it is possible to control the pass phase of the transmission module to a setting value with a much higher degree of accuracy.

Moreover, even if there occur an environmental change due to temperature, etc., and/or mutual variation among a plurality of transmission modules, it is possible to control the phase without being affected by the influence thereof.

Tenth Embodiment

Figure 14:
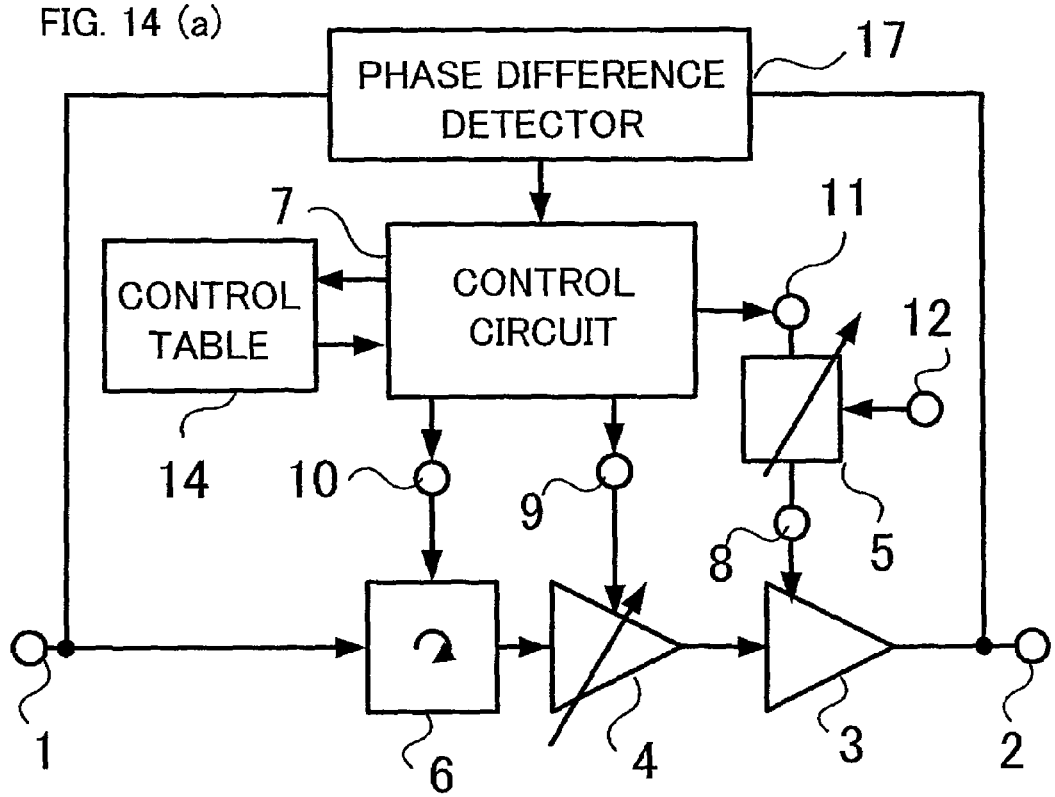
FIG. 14 is circuit block diagrams showing transmission modules, respectively, according to a tenth embodiment of the present invention. (Tenth Embodiment)
Figure 14:
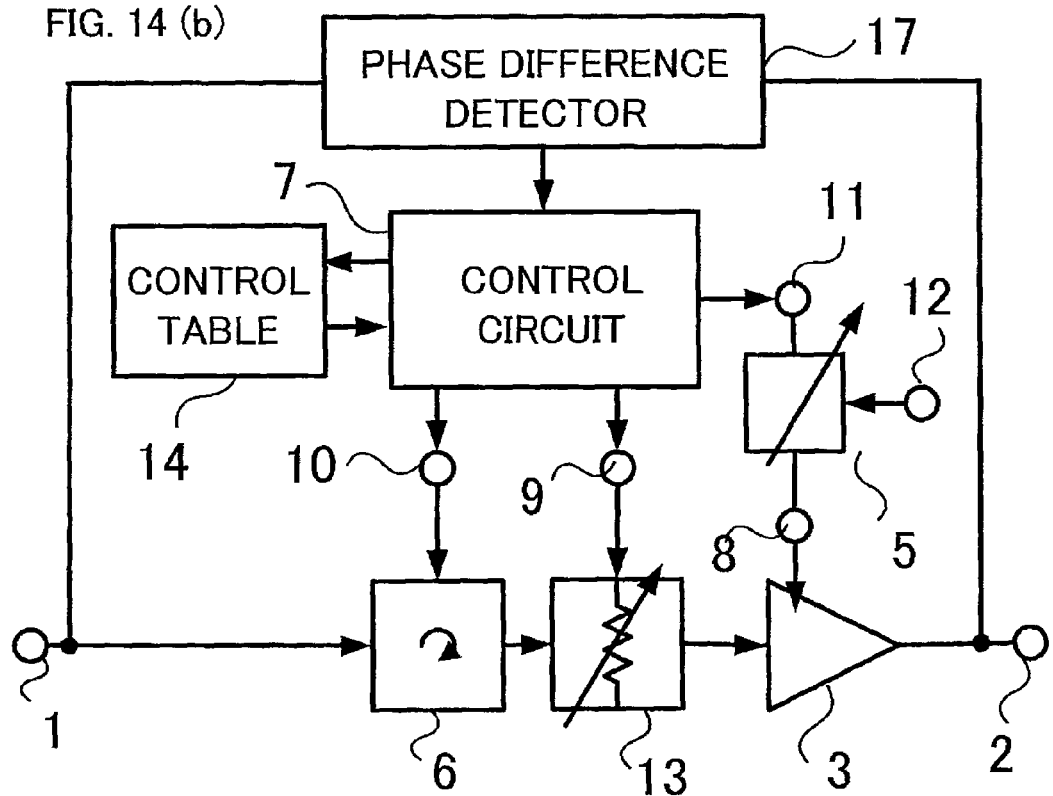

Here, note that in the above-mentioned eighth and ninth embodiments (FIG. 11, FIG. 13), phase control has been carried out based on the input and output phase information, but as shown in FIG. 14, a phase difference detector 17 (a phase comparator, etc.) may be provided, so that phase control is carried out based on a phase difference between input phase information and output phase information.

FIG. 14 is circuit block diagrams showing transmission modules, respectively, according to a tenth embodiment of the present invention, wherein those which are similar to the aforementioned ones (see FIG. 9, FIG. 11 and FIG. 13) are denoted by the same reference numerals and characters as those in the aforementioned ones, while omitting a detailed explanation thereof.

Although here are typically shown examples in which the phase difference detector 17 is received in the circuit arrangements of the seventh embodiment (FIG. 9), it goes without saying that the invention can be applied to the arrangements of the other embodiments.

FIG. 14(a) and FIG. 14(b) show different arrangement examples, respectively, wherein the difference between the individual circuit arrangements is only in that either one of the variable gain amplifier 4 and the variable attenuator 13 is used as a gain variable unit (an amplitude control unit).

In FIG. 14(a), the transmission module is provided, in addition to the above-mentioned arrangement (FIG. 9), with the phase difference detector 17 that serves to detect a phase difference between the input signal and the output signal.

In FIG. 14(a), its difference from FIG. 9(a) is only in that the phase difference detector 17 is provided, and that the control circuit 7 controls the phase of the transmission module by controlling the phase shifter 6 through the control terminal 10 of the phase control unit, based on detected phase difference information.

The phase difference detector 17 is assumed to include the functions of the first and second phase detectors 15, 16 shown in FIG. 13, too.

As described above, according to the tenth embodiment (FIG. 14) of the present invention, the phase difference detector 17 to detect the phase difference between input phase information and output phase information is provided, and the control circuit 7 and the phase shifter 6 (the phase control unit) control the phase based on the phase difference information detected by the phase difference detector 17. As a result, it is possible to achieve the same operational effects as those in the above-mentioned ninth embodiment.

In addition, the two phase detectors 15, 16 can be achieved by the single phase difference detector 17 (phase comparator), and hence, it is possible to reduce the overall size thereof.

Eleventh Embodiment

Figure 15:
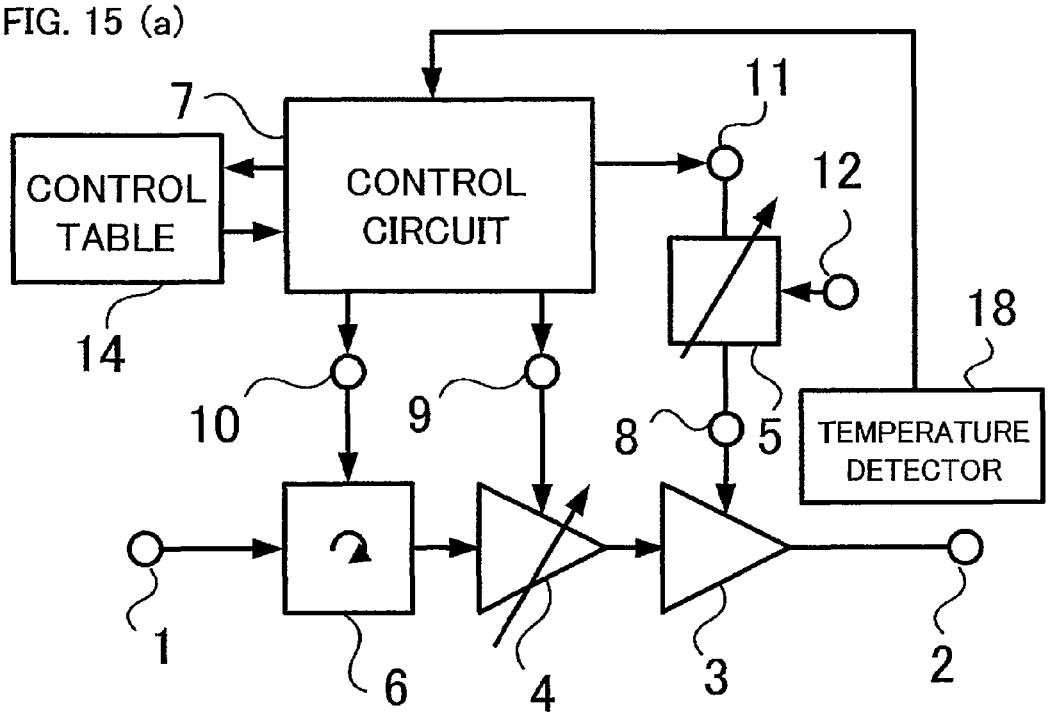
FIG. 15 is circuit block diagrams showing transmission modules, respectively, according to an eleventh embodiment of the present invention. (Eleventh Embodiment)
Figure 15:
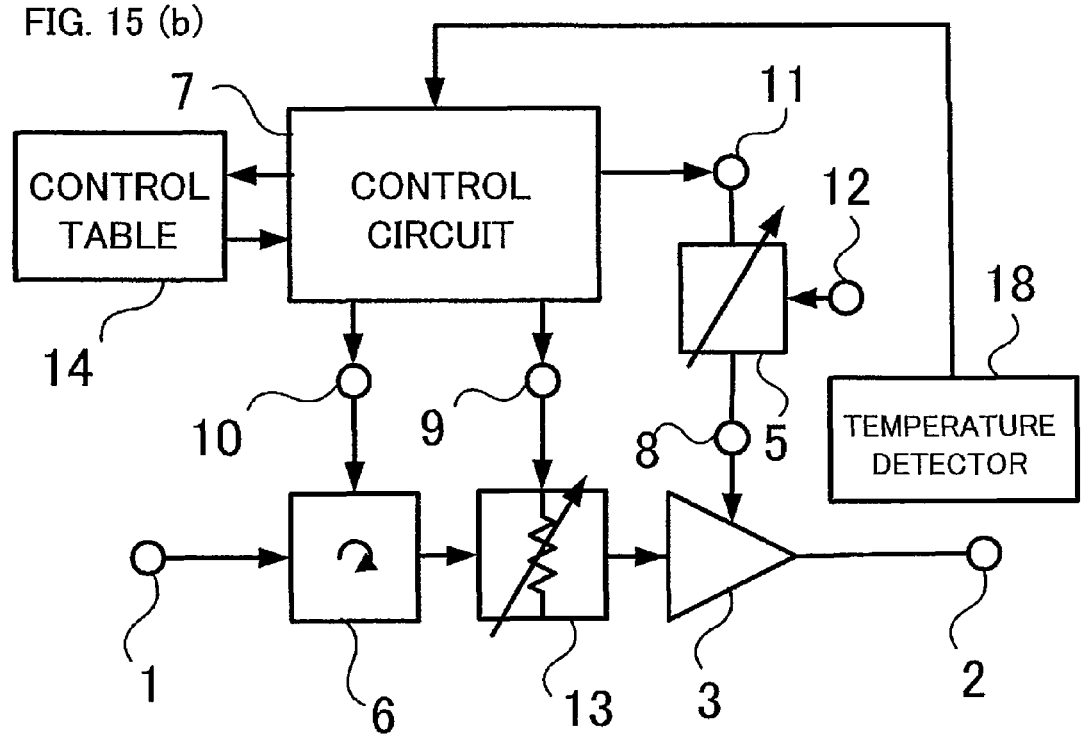

Here, note that in the above-mentioned eighth through tenth embodiments (FIG. 11, FIG. 13, FIG. 14), the phase is detected so that it is controlled in a feedback manner, but as shown in FIG. 15, a temperature detector 18 may be provided, so that the power supply voltage, the gain and the phase may be controlled in a feedback manner based on temperature information.

FIG. 15 is circuit block diagrams showing transmission modules, respectively, according to an eleventh embodiment of the present invention, wherein those which are similar to the aforementioned ones (see FIG. 9) are denoted by the same reference numerals and characters as those in the aforementioned ones, while omitting a detailed explanation thereof.

Although here are typically shown examples in which the temperature detector 18 is received in the circuit arrangements of the seventh embodiment (FIG. 9), it goes without saying that the invention can be applied to the arrangements of the other embodiments.

FIG. 15(a) and FIG. 15(b) show different arrangement examples, respectively, wherein the difference between the individual circuit arrangements is only in that either one of the variable gain amplifier 4 and the variable attenuator 13 is used as a gain variable unit (an amplitude control unit).

In FIG. 15(a), the transmission module is provided, in addition to the above-mentioned arrangement (FIG. 9), with the temperature detector 18 that serves to detect an environmental temperature in the vicinity of the high frequency signal output terminal 2.

In FIG. 15 (a), its difference from FIG. 9(a) is only in that the temperature detector 18 is provided, and that the control circuit 7 controls, based on the detected temperature information, the power supply voltage of the high frequency amplifier 3 according to the output power, and at the same time controls the variable gain amplifier 4 (the amplitude control unit) and the phase shifter 6 (the phase control unit).

As described above, according to the eleventh embodiment of the present invention, the temperature detector 18 to detect the temperature is provided, wherein the control circuit 7 and the variable gain amplifier 4 (the amplitude control unit) control the gain based on the temperature information detected by the temperature detector 18, and the control circuit 7 and the phase shifter 6 (the phase control unit) control the phase based on the temperature information. As a result, it is possible to achieve the same operational effects as those in the above-mentioned seventh embodiment.

In addition, the control is carried out based on the temperature information obtained by the temperature detector 18, so that it is possible to compensate for variation in the amplitude and the pass phase of the transmission module resulting from a temperature change, and hence, even if the temperature changes, it is possible to control the amplitude and the pass phase of the transmission module to their setting values in an accurate manner.

Moreover, in cases where the control table 14 is used, as shown in FIG. 15, the amplitude and the pass phase of the transmission module can be controlled to the setting values with a much higher degree of accuracy by setting the above-mentioned control table (FIG. 10, FIG. 12) corresponding to each temperature.

Further, the temperature detector 18 has been provided for the transmission module of FIG. 9, but in cases where the temperature detector 18 is provided for each of the transmission modules of FIG. 1, FIG. 4 through FIG. 8, FIG. 11, FIG. 13, and FIG. 14, too, the same operational effects can be achieved.

Twelfth Embodiment

Figure 16:
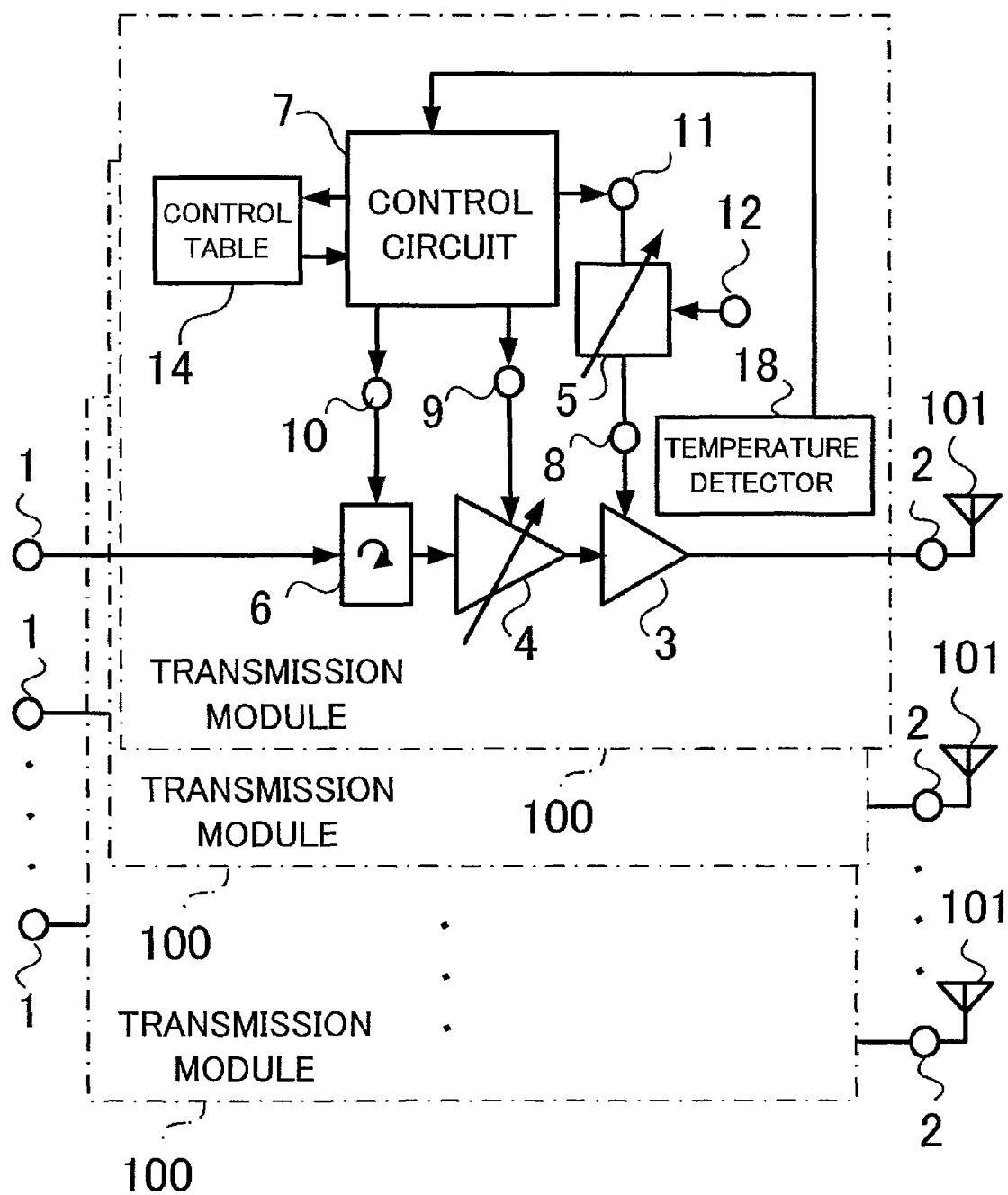
FIG. 16 is a circuit block diagram showing a phased array antenna apparatus according to a twelfth embodiment of the present invention. (Twelfth Embodiment)

Although in the above-mentioned first through eleventh embodiments (FIG. 1 through FIG. 15), the description has been made focusing on a transmission module, a phased array antenna apparatus may be constructed by the use of a plurality of transmission modules 100, as shown in FIG. 16.

FIG. 16 is a circuit block diagram showing a phased array antenna apparatus according to a twelfth embodiment of the present invention, wherein those which are similar to the aforementioned ones (see FIG. 15) are denoted by the same reference numerals and characters as those in the aforementioned ones, while omitting a detailed explanation thereof.

Although here are typically shown an example in which a phased array antenna apparatus is constructed by the use of transmission modules each of which is described in the eleventh embodiment (FIG. 15), it goes without saying that the invention can be applied to the arrangements of the other embodiments.

In addition, here, there is shown only the case where the variable gain amplifier 4 is used as a typical example of the amplitude control unit.

In FIG. 16, the phased array antenna apparatus is composed of the plurality of transmission modules 100 arranged in parallel with one another, wherein an element antenna 101 is arranged at a high frequency signal output terminal 2 of each of the transmission modules 100.

Because a control table 14 and a temperature detector 18 are provided in each transmission module 100, the amplitude and the pass phase of each transmission module 100 are controlled to their setting values with a high degree of accuracy. In addition, a signal radiated from each element antenna 101 as the phased array antenna apparatus can be controlled not only in phase but also in amplitude.

Accordingly, the phased array antenna apparatus shown in FIG. 16 can achieve a high directional gain as well as a low side lobe level at the same time.

In addition, because a power supply voltage applied to the high frequency amplifier 3 in each transmission module 100 is controlled in accordance with the setting value of the output power of each transmission module 100, each transmission module can operate with high efficiency, thereby making it possible for the phased array antenna apparatus to reduce electric power consumption.

Moreover, although the arrangement of FIG. 15(a) has been used as each transmission module 100, in cases where the arrangements of FIG. 1, FIG. 4 through FIG. 9, FIG. 11, FIG. 13, FIG. 14, and FIG. 15(b) are used, too, the same operational effects can be achieved.

EXPLANATION OF REFERENCE NUMERALS AND CHARACTERS

1 high frequency signal input terminal, 2 high frequency signal output terminal, 3 high frequency amplifier, 4 variable gain amplifier (amplitude control unit), 5 variable voltage source (power supply voltage control unit), 6 phase shifter (phase control unit), 7 control circuit, 13 variable attenuator (amplitude control unit), 14 control table, 15 phase detector (first phase detector), 16 phase detector (second phase detector), 17 phase difference detector, 18 temperature detector, 19 frequency converter (first frequency converter), 20 oscillator,

21 DDS (second DDS), 22 phase shifter, 23 frequency converter (second frequency converter), 24 DDS (first DDS), 25 baseband digital signal input terminal, 26 baseband analog signal input terminal, 100 transmission module, 101 element antenna

The invention claimed is:

1. A transmission module comprising:
a high frequency amplifier;
an amplitude control unit that sets a gain of an input signal to said high frequency amplifier in a variable manner;
a phase control unit that sets a phase of the input signal to said high frequency amplifier in a variable manner;
a power supply voltage control unit that sets a power supply voltage to said high frequency amplifier in a variable manner; and
a control circuit that controls said amplitude control unit, said phase control unit and said power supply voltage control unit in accordance with an input/output characteristic of the high frequency amplifier;
wherein said control circuit and said power supply voltage control unit control said power supply voltage such that a gain of said high frequency amplifier becomes constant in accordance with an output power of said high frequency amplifier,
said phase control unit includes:
an oscillator;
a frequency converter that is connected to an input side of said amplitude control unit; and
a DDS that is connected to an input side of said frequency converter; and
wherein an input signal to said high frequency amplifier is generated by carrying out frequency conversion of a baseband signal generated by said DDS by the use of a local signal generated by said oscillator and said frequency converter.

2. The transmission module as set forth in claim 1, wherein said control circuit controls said amplitude control unit and said phase control unit in such a manner as to compensate for individual changes in a gain and a pass phase of said high frequency amplifier, which are generated in accordance with a change in said power supply voltage.

3. The transmission module as set forth in claim 1, further comprising:
a control table in which power supply voltage setting values with respect to the output power of said high frequency amplifier, gain change setting values with respect to said amplitude control unit, and phase change setting values with respect to said phase control unit have been stored;
wherein said control circuit and said power supply voltage control unit control said power supply voltage based on said power supply voltage setting values;
said control circuit and said amplitude control unit control said gain based on said gain change setting values; and
said control circuit and said phase control unit control said phase based on said phase change setting values.

4. The transmission module as set forth in claim 1, further comprising:
a first phase detection unit that serves to detect a phase of an output signal of said high frequency amplifier;
wherein said control circuit and said phase control unit control said phase based on output phase information detected by said first phase detection unit.

5. The transmission module as set forth in claim 4, further comprising:
a second phase detection unit that serves to detect a phase of an input signal of said high frequency amplifier;
wherein said control circuit and said phase control unit control said phase based on output phase information and input phase information detected by said first and second phase detection units.

6. The transmission module as set forth in claim 5, further comprising:
a phase difference detection unit that serves to detect a phase difference between said input phase information and said output phase information;
wherein said control circuit and said phase control unit control said phase based on phase difference information detected by said phase difference detection unit.

7. The transmission module as set forth in claim 1, further comprising:
a temperature detection unit that serves to detect a temperature;
wherein said control circuit and said amplitude control unit control said gain based on temperature information detected by said temperature detection unit; and
said control circuit and said phase control unit control said phase based on said temperature information.

8. The transmission module as set forth in claim 1, wherein said power supply voltage control unit includes a DC-DC converter.

9. The transmission module as set forth in claim 1, wherein said amplitude control unit includes a variable gain amplifier.

10. The transmission module as set forth in claim 1, wherein said amplitude control unit includes a variable attenuator.

11. The transmission module as set forth in claim 1, wherein said phase control unit includes a phase shifter.

12. A transmission module comprising:
a high frequency amplifier;
an amplitude control unit that sets a gain of an input signal to said high frequency amplifier in a variable manner;
a phase control unit that sets a phase of the input signal to said high frequency amplifier in a variable manner;
a power supply voltage control unit that sets a power supply voltage to said high frequency amplifier in a variable manner; and
a control circuit that controls said amplitude control unit, said phase control unit and said power supply voltage control unit in accordance with an input/output characteristic of the high frequency amplifier;
wherein said control circuit and said power supply voltage control unit control said power supply voltage such that a gain of said high frequency amplifier becomes constant in accordance with an output power of said high frequency amplifier,
said phase control unit includes:
an oscillator;
a frequency converter that is connected to an input side of said amplitude control unit; and
a phase shifter that is inserted between said oscillator and said frequency converter;
wherein an input signal to said high frequency amplifier is generated by carrying out frequency conversion of a baseband signal inputted to said frequency converter by the use of a local signal generated by said oscillator and said frequency converter.

13. A transmission module comprising:
a high frequency amplifier,
an amplitude control unit that sets a gain of an input signal to said high frequency amplifier in a variable manner;

a phase control unit that sets a phase of the input signal to said high frequency amplifier in a variable manner;

a power supply voltage control unit that sets a power supply voltage to said high frequency amplifier in a variable manner; and a control circuit that controls said amplitude control unit, said phase control unit and said power supply voltage control unit in accordance with an input/output characteristic of the high frequency amplifier;

wherein said control circuit and said power supply voltage control unit control said power supply voltage such that a gain of said high frequency amplifier becomes constant in accordance with an output power of said high frequency amplifier, said phase control unit includes:

an oscillator;

a first frequency converter that is connected to an input side of said amplitude control unit;

a second frequency converter that is inserted between said oscillator and said first frequency converter; and a first DDS that is connected to said second frequency converter;

wherein by using, as a local signal, a signal obtained by carrying out frequency conversion of individual output signals of said oscillator and said first DDS by means of said second frequency converter, an input signal to said high frequency amplifier is generated by carrying out frequency conversion of a baseband signal inputted to said first frequency converter by the use of said local signal and said first frequency converter.

14. A phased array antenna comprising the transmission module as set forth in claim 1.

15. A transmission module comprising:

a high frequency amplifier;

an amplitude control unit that sets a gain of an input signal to said high frequency amplifier in a variable manner;

a phase control unit that sets a phase of the input signal to said high frequency amplifier in a variable manner;

a power supply voltage control unit that sets a power supply voltage to said high frequency amplifier in a variable manner; and a control circuit that controls said amplitude control unit, said phase control unit and said power supply voltage control unit;

wherein said control circuit and said power supply voltage control unit control said power supply voltage in accordance with an output power of said high frequency amplifier;

wherein said phase control unit includes:

an oscillator;

a frequency converter that is connected to an input side of said amplitude control unit; and a phase shifter that is inserted between said oscillator and said frequency converter;

wherein an input signal to said high frequency amplifier is generated by carrying out frequency conversion of a baseband signal inputted to said frequency converter by the use of a local signal generated by said oscillator and said frequency converter;

wherein said phase control unit includes:

a DDS that is connected to an input side of said frequency converter, and generates said baseband signal;

wherein said DDS is used in order to compensate for a change of a pass phase generated in said high frequency amplifier; and said phase shifter is used for beam forming of a phased array antenna apparatus.

16. A transmission module comprising:

a high frequency amplifier;

an amplitude control unit that sets a gain of an input signal to said high frequency amplifier in a variable manner;

a phase control unit that sets a phase of the input signal to said high frequency amplifier in a variable manner;

a power supply voltage control unit that sets a power supply voltage to said high frequency amplifier in a variable manner; and a control circuit that controls said amplitude control unit, said phase control unit and said power supply voltage control unit;

wherein said control circuit and said power supply voltage control unit control said power supply voltage in accordance with an output power of said high frequency amplifier;

wherein said phase control unit includes:

an oscillator;

a first frequency converter that is connected to an input side of said amplitude control unit;

a second frequency converter that is inserted between said oscillator and said first frequency converter; and a first DDS that is connected to said second frequency converter;

wherein by using, as a local signal, a signal obtained by carrying out frequency conversion of individual output signals of said oscillator and said first DDS by means of said second frequency converter, an input signal to said high frequency amplifier is generated by carrying out frequency conversion of a baseband signal inputted to said first frequency converter by the use of said local signal and said first frequency converter;

wherein said phase control unit includes:

a second DDS that is connected to an input side of said frequency converter, and generates said baseband signal;

wherein said second DDS is used in order to compensate for a change of a pass phase generated in said first high frequency amplifier; and said first DDS is used for beam forming of a phased array antenna apparatus.

* * * * *